(12) United States Patent
Nishimura et al.

(10) Patent No.: US 11,315,866 B2
(45) Date of Patent: Apr. 26, 2022

(54) SEMICONDUCTOR DEVICE

(71) Applicant: ROHM CO., LTD., Kyoto (JP)

(72) Inventors: Isamu Nishimura, Kyoto (JP); Hirofumi Takeda, Kyoto (JP); Hideaki Yanagida, Kyoto (JP); Taro Hayashi, Kyoto (JP); Natsuki Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 28 days.

(21) Appl. No.: 16/893,650

(22) Filed: Jun. 5, 2020

(65) Prior Publication Data

US 2020/0411425 A1 Dec. 31, 2020

(30) Foreign Application Priority Data

Jun. 27, 2019 (JP) .............................. JP2019-120264

(51) Int. Cl.
*H01L 29/40* (2006.01)
*H01L 23/498* (2006.01)
*H01L 23/48* (2006.01)
*H01L 21/48* (2006.01)
*H01L 23/00* (2006.01)
*H01L 43/04* (2006.01)

(52) U.S. Cl.
CPC ...... *H01L 23/49866* (2013.01); *H01L 21/486* (2013.01); *H01L 23/481* (2013.01); *H01L 23/49827* (2013.01); *H01L 24/16* (2013.01); *H01L 24/81* (2013.01); *H01L 43/04* (2013.01); *H01L 2224/10175* (2013.01); *H01L 2224/16238* (2013.01); *H01L 2224/81395* (2013.01); *H01L 2224/81455* (2013.01); *H01L 2224/81815* (2013.01); *H01L 2924/12041* (2013.01)

(58) Field of Classification Search
None
See application file for complete search history.

(56) References Cited

U.S. PATENT DOCUMENTS 6,306,680 B1 * 10/2001 Fillion .................... H01L 24/92
438/106
2010/0195292 A1 * 8/2010 Ide ....................... H01L 23/49811
361/748

FOREIGN PATENT DOCUMENTS

JP 2013-197263 A 9/2013

* cited by examiner

*Primary Examiner* — Hung K Vu
(74) *Attorney, Agent, or Firm* — Hamre, Schumann, Mueller & Larson, P.C.

(57) ABSTRACT

A semiconductor device includes: a substrate including a main surface; a wiring portion including a first conductive layer formed on the main surface, and a first plating layer which is provided on the first conductive layer and on which an oxide film is formed; a semiconductor element including an element mounting surface and an element electrode formed on the element mounting surface; a bonding portion including a second plating layer made of the same material as the first plating layer and laminated on the first conductive layer, and a solder layer laminated on the second plating layer and bonded to the element electrode; and a sealing resin covering the semiconductor element.

18 Claims, 18 Drawing Sheets

US 11,315,866 B2

SEMICONDUCTOR DEVICE

CROSS-REFERENCE TO RELATED APPLICATION

This application is based upon and claims the benefit of priority from Japanese Patent Application No. 2019-120264, filed on Jun. 27, 2019, the entire contents of which are incorporated herein by reference.

TECHNICAL FIELD

The present disclosure relates to a semiconductor device.

BACKGROUND

In the related art, an electronic component including an element such as a resistor or a semiconductor chip includes a substrate on which the element is mounted and a sealing resin that covers the element. For example, in the related art, there is disclosed a semiconductor device including a wiring body having external connection terminals on one surface and a semiconductor chip mounted on the other surface, and a sealing resin formed on the other surface of the wiring body so as to seal the semiconductor chip.

The semiconductor chip is soldered to a conductive layer of the wiring body by a reflow process. Cu (copper) is used for the conductive layer. For this reason, the solder that is in a liquid phase due to the heating during the reflow process may flow out along the conductive layer. As a result, the thickness of the solder varies, and the semiconductor chip may be inclined. In addition, the solder may flow out in an unintended direction, which may cause a short-circuit failure.

SUMMARY

Some embodiments of the present disclosure provide a semiconductor device capable of suppressing the outflow of a solder.

According to an embodiment of the present disclosure, a semiconductor device includes: a substrate including a main surface; a wiring portion including a first conductive layer formed on the main surface, and a first plating layer which is provided on the first conductive layer and on which an oxide film is formed; a semiconductor element including an element mounting surface and an element electrode formed on the element mounting surface; a bonding portion including a second plating layer laminated on the first conductive layer, and a solder layer laminated on the second plating layer and bonded to the element electrode; and a sealing resin covering the semiconductor element.

With this configuration, the first plating layer on which the oxide film is formed and the second plating layer laminated on the first conductive layer can suppress an outflow of the solder layer by a reflow process when mounting the semiconductor element According to another embodiment of the present disclosure, a semiconductor device includes: a substrate including a main surface; a wiring portion including a first conductive layer formed on the main surface, a first plating layer which is provided on an upper surface of the first conductive layer and on which an oxide film is formed, and a second conductive layer provided on an upper surface of the first plating layer; a semiconductor element including an element mounting surface and an element electrode formed on the element mounting surface; a bonding portion including a second plating layer laminated on the second conductive layer, and a solder layer laminated on the second plating layer and bonded to the element electrode; and a sealing resin covering the semiconductor element.

With this configuration, the first plating layer on which the oxide film is formed and the second plating layer laminated on the first conductive layer can suppress an outflow of the solder layer by a reflow process when mounting the semiconductor element.

DETAILED DESCRIPTION

Embodiments and modifications will be now described with reference to the drawings. The following embodiments and modifications are examples of configurations and methods for embodying the technical idea, and the materials, shapes, structures, arrangements, dimensions and the like of the respective components are not limited to the following. Various changes can be added to the following embodiments and modifications. The following embodiments and modifications can be implemented in combination to the extent they are not technically inconsistent.

First Embodiment

Figure 1:
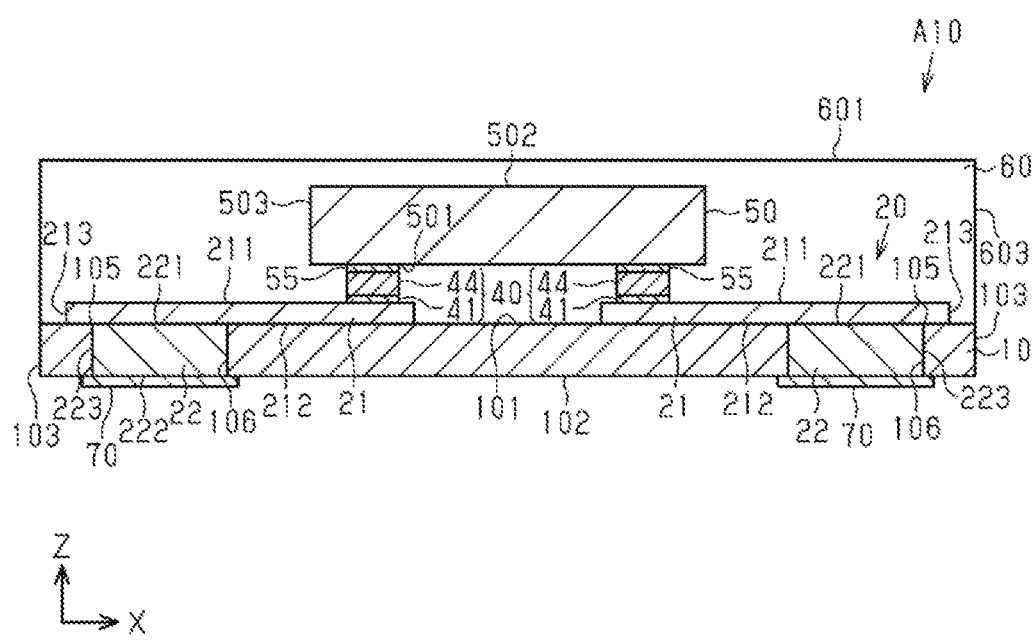
FIG. 1 is a schematic cross-sectional view showing a semiconductor device according to a first embodiment of the present disclosure.
Figure 2:
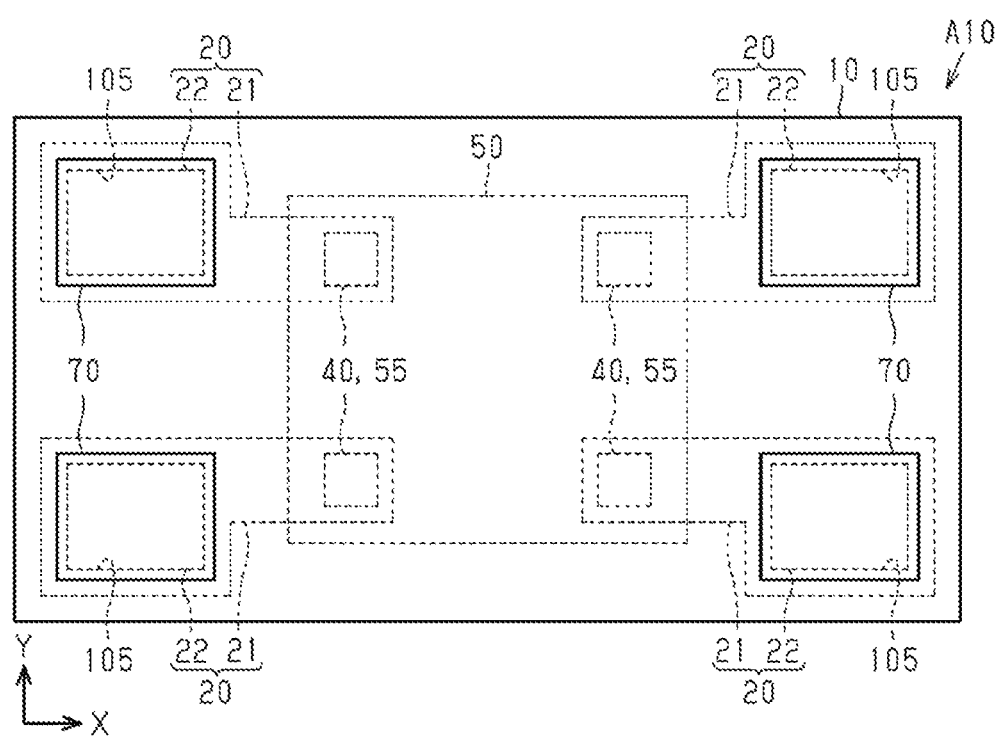
FIG. 2 is a schematic plan view showing the semiconductor device according to the first embodiment.

A semiconductor device A10 according to a first embodiment of the present disclosure will be described below. As shown in FIGS. 1 and 2, the semiconductor device A10 includes a substrate 10, a wiring portion 20, a bonding portion 40, a semiconductor element 50, a sealing resin 60 and an external conductive film 70. The wiring portion 20 includes a main surface wiring 21 and a through-wiring 22.

Figure 3:
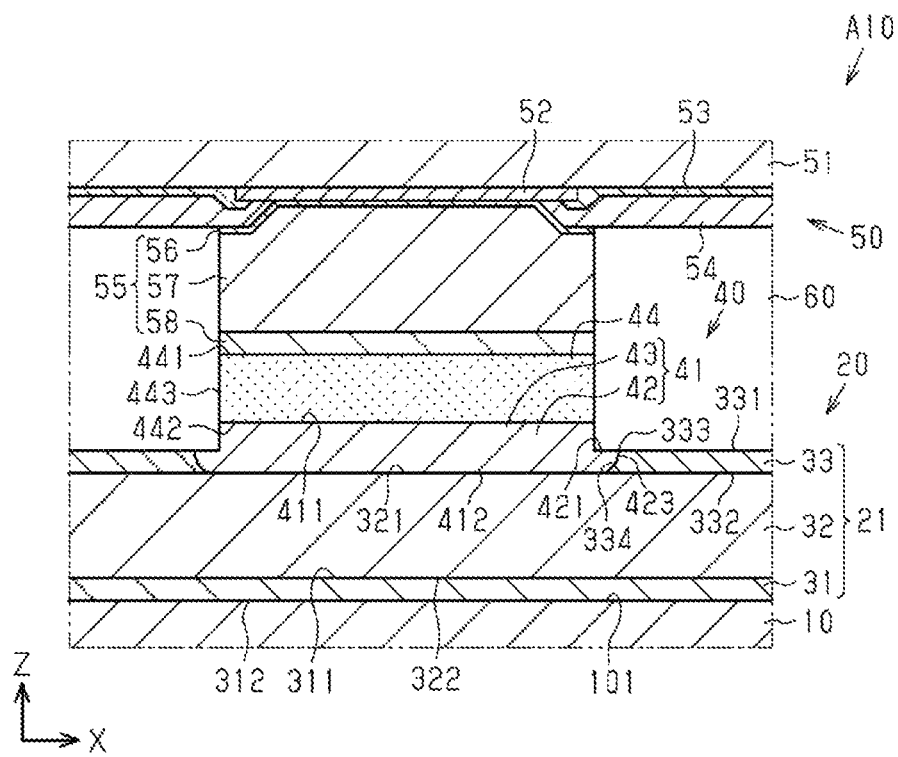
FIG. 3 is a partially enlarged cross-sectional view of the semiconductor device according to the first embodiment.

FIG. 1 is a cross-sectional view of the semiconductor device A10 according to the first embodiment. FIG. 2 is a schematic plan view of the semiconductor device A10 as viewed from the substrate 10 side. In addition, for convenience of understanding, in FIG. 2, each member provided in the semiconductor device A10 is shown by a broken line so as to appear transparent through the substrate 10 and the sealing resin 60 and show a positional relationship between the members. FIG. 3 is a partially enlarged cross-sectional view of the semiconductor device A10, showing the wiring portion 20, the bonding portion 40 and a portion of the semiconductor element 50.

The semiconductor device A10 shown in these figures is a device that is surface-mounted on a circuit board of various electronic devices. Here, for convenience of description, a thickness direction of the substrate 10 is referred to as a thickness direction z. In addition, a direction (a horizontal direction in a plan view) along one side of the semiconductor device A10 orthogonal to the thickness direction z is referred to as a first direction x. A direction orthogonal to both the thickness direction z and the first direction x of the substrate 10 (a vertical direction in the plan view) is referred to as a second direction y. As shown in FIG. 2, the semiconductor device A10 has a rectangular shape when viewed in the thickness direction z.

The substrate 10 is a support member on which the semiconductor element 50 is mounted and which serves as a base for the semiconductor device A10. The shape of the substrate 10 as viewed from the thickness direction z is a rectangular shape having long sides along the first direction x, as shown in FIG. 2.

The substrate 10 includes a substrate main surface 101, a substrate back surface 102 and a plurality of substrate side surfaces 103. The substrate main surface 101 and the substrate back surface 102 face opposite sides in the thickness direction z. The substrate main surface 101 is flat. The substrate back surface 102 is also flat. Each of the substrate side surfaces 103 is sandwiched between the substrate main surface 101 and the substrate back surface 102. The substrate side surfaces 103 face one of the first direction x and the second direction y. Each of the respective substrate side surfaces 103 is flat. The substrate side surfaces 103 intersect with the substrate main surface 101 and the substrate back surface 102, and are orthogonal in the first embodiment.

The substrate 10 is made of, for example, a material having electrical insulation properties. As this material, for example, a synthetic resin mainly made of an epoxy resin or the like, ceramics, glass, or the like can be used. The substrate 10 includes a plurality of through-holes 105 penetrating the substrate 10 from the substrate main surface 101 to the substrate back surface 102 in the thickness direction z. In the first embodiment, the substrate 10 includes four through-holes 105. The through-holes 105 are formed near four corners of the substrate 10, respectively. The through-holes 105 have, for example, a rectangular shape when viewed from the thickness direction z. In addition, a shape of the through-holes 105 may be circular or polygonal.

The wiring portion 20 includes a plurality of main surface wirings 21 and a plurality of through-wirings 22. The through-wirings 22 are arranged in the through-holes 105, respectively. Each through-wiring 22 includes an upper surface 221, a lower surface 222 and a plurality of side surfaces 223. The upper surface 221 and the lower surface 222 face opposite sides in the thickness direction z. Each side surface 223 is sandwiched between the upper surface 221 and the lower surface 222. In the first embodiment, the upper surface 221 of the through-wiring 22 is flush with the substrate main surface 101 of the substrate 10. In the first embodiment, the lower surface 222 of the through-wiring 22 is flush with the substrate back surface 102 of the substrate 10. The lower surface 222 is an exposed surface exposed from the substrate back surface 102 of the substrate 10. Note that at least one of the upper surface 221 and the lower surface 222 of the through-wiring 22 may not be flush with the substrate main surface 101 and the substrate back surface 102 of the substrate 10. Further, the side surface 223 of the through-wiring 22 is in contact with the inner wall surface 106 of the through-hole 105. The through-wiring 22 is made of a material having electrical conductivity. As the material of the through-wiring 22, for example, Cu, Cu alloy, or the like can be used.

The main surface wiring 21 is formed on the substrate main surface 101 of the substrate 10. The main surface wiring 21 is made of a material having electrical conductivity and is electrically connected to the through-wiring 22. The main surface wiring 21 includes an upper surface 211, a lower surface 212, and a side surface 213. The upper surface 211 of the main surface wiring 21 faces the same direction as the substrate main surface 101 of the substrate 10. The lower surface 212 of the main surface wiring 21 faces the same direction as the substrate back surface 102 of the substrate 10 and faces the substrate main surface 101 of the substrate 10. The side surface 213 of the main surface wiring 21 faces the same direction as the substrate side surface 103 of the substrate 10. The side surface 213 of the main surface wiring 21 intersects with the upper surface 211 and the lower surface 212 of the main surface wiring 21.

As shown in FIG. 3, the main surface wiring 21 includes a metal layer 31, a conductive layer 32, and a first plating layer 33. The metal layer 31, the conductive layer 32, and the first plating layer 33 are laminated on the substrate main surface 101 of the substrate 10 in this order. The thickness of the first plating layer 33 is, for example, not less than 1 μm and not more than 3 μm.

The metal layer 31 includes, for example, a Ti (titanium) layer in contact with the substrate main surface 101 of the substrate 10 and the upper surface 221 of the through-wiring 22 shown in FIG. 1, and a Cu layer in contact with the Ti layer. The metal layer 31 is formed as a seed layer for forming the conductive layer 32. The metal layer 31 includes an upper surface 311 and a lower surface 312 facing opposite sides in the thickness direction z.

The conductive layer 32 is formed on the upper surface 311 of the metal layer 31. The conductive layer 32 is made of Cu or a Cu alloy. The conductive layer 32 includes an upper surface 321 and a lower surface 322 facing opposite sides in the thickness direction z.

The first plating layer 33 is formed on the upper surface 321 of the conductive layer 32. The first plating layer 33 is formed so as to cover the entire upper surface 321 of the conductive layer 32. The first plating layer 33 is a plating layer (first plating layer) on which an oxide film is formed. The first plating layer 33 is made of, for example, Ni. The first plating layer 33 includes an upper surface 331 and a lower surface 332 facing opposite sides in the thickness direction z.

The upper surface 331 of the first plating layer 33 faces the same direction as the upper surface 321 of the conductive layer 32. The first plating layer 33 includes an opening 333 exposing a portion of the upper surface 321 of the conductive layer 32. The opening 333 is formed so that the upper surface 321 of the conductive layer 32 is exposed more than a mounting electrode 55 of the semiconductor element 50 when viewed from the thickness direction z.

The first plating layer 33 includes an inner wall surface 334 formed by the opening 333. The inner wall surface 334 is a curved surface curved so as to be concave from the inside of the opening 333 toward the inside of the first plating layer 33. The inner wall surface 334 is formed such that an opening width of the lower surface 332 of the first plating layer 33 is smaller than an opening width of the upper surface 331 of the first plating layer 33. In the first plating layer 33, an oxide film may be formed on the upper surface 331 and no oxide film is formed on the inner wall surface 334.

As shown in FIGS. 1 and 3, the bonding portion 40 is formed on the main surface wiring 21. The bonding portion 40 is electrically connected to the wiring portion 20. The bonding portion 40 bonds the semiconductor element 50 to the wiring portion 20. The bonding portion 40 includes a second plating layer 41 and a solder layer 44. The second plating layer 41 and the solder layer 44 are laminated on the main surface wiring 21 of the wiring portion 20 in this order. The second plating layer 41 is made of Ni (nickel). The solder layer 44 is made of Sn (tin) or an alloy containing Sn. This alloy is, for example, a Sn—Ag (silver)-based alloy, a Sn—Sb (antimony)-based alloy, or the like.

As shown in FIG. 3, the second plating layer 41 is formed on the upper surface 321 of the conductive layer 32 constituting the wiring portion 20. The second plating layer 41 includes an upper surface 411 and a lower surface 412. The upper surface 411 faces the same direction as the upper surface 321 of the conductive layer 32. The lower surface 412 faces the upper surface 321 of the conductive layer 32. The lower surface 412 of the second plating layer 41 is in contact with the upper surface 321 of the conductive layer 32. The thickness of the second plating layer 41 is, for example, not less than 3 μm and not more than 5 μm. The second plating layer 41 is made of Ni. That is, the second plating layer 41 is made of the same conductive metal material as the first plating layer 33.

The second plating layer 41 includes a filling portion 42 and a protruding portion 43. The filling portion 42 is made of plating metal filled in the opening 333 of the first plating layer 33. The upper surface 421 of the filling portion 42 is flush with the upper surface 331 of the first plating layer 33. The lower surface of the filling portion 42 is the lower surface 412 of the second plating layer 41 and is in contact with the upper surface 321 of the conductive layer 32. The side surface 423 of the filling portion 42 is in contact with the inner wall surface 334 of the opening 333 of the first plating layer 33. That is, the side surface 423 is a curved surface that protrudes outward. The inner wall surface 334 of the first plating layer 33 and the side surface 423 of the filling portion 42 of the second plating layer 41 serve as an interface between the first plating layer 33 and the second plating layer 41.

The protruding portion 43 is formed to extend from the upper surface 421 of the filling portion 42 in the thickness direction z. The protruding portion 43 protrudes from the upper surface 331 of the first plating layer 33 in the thickness direction z. Further, the protruding portion 43 is smaller than the filling portion 42 when viewed from the thickness direction z. In other words, the filling portion 42 is larger than the protruding portion 43 when viewed from the thickness direction z.

The solder layer 44 is formed on the upper surface 411 of the second plating layer 41. The solder layer 44 includes an upper surface 441, a lower surface 442, and a side surface 443. The upper surface 441 of the solder layer 44 faces the same direction as the upper surface 411 of the second plating layer 41. The lower surface 442 of the solder layer 44 opposes the upper surface 411 of the second plating layer 41 and is in contact with the upper surface 411 thereof. The solder layer 44 overlaps the protruding portion 43 of the second plating layer 41.

As shown in FIG. 2, the semiconductor element 50 has a rectangular shape when viewed from the thickness direction z. As shown in FIG. 1, the semiconductor element 50 includes an element main surface 501 and an element back surface 502 that face opposite sides in the thickness direction z, and an element side surface 503 that extends in the thickness direction z. The element side surface 503 intersects with the element main surface 501 and the element back surface 502. The element main surface 501 faces the substrate main surface 101 of the substrate 10. The element back surface 502 faces the same direction as the substrate main surface 101 of the substrate 10.

The semiconductor element 50 is, for example, an integrated circuit (IC) such as an LSI (Large Scale Integration). The semiconductor element 50 may be a voltage control element such as an LDO (Low Drop Out), an amplification element such as an operational amplifier, or a discrete semiconductor element such as a diode or various sensors. The element main surface 501 is a surface on which constituent members for a function of the semiconductor element 50 are formed. The semiconductor element 50 has the mounting electrode 55 for mounting on the element main surface 501 side. The mounting electrode 55 is mounted on the substrate 10 by the solder layer 44 of the bonding portion 40. That is, the semiconductor element 50 is mounted with the element main surface 501 facing the substrate 10. Accordingly, it can be said that the element main surface 501 is an element mounting surface for mounting the semiconductor element 50.

As shown in FIG. 3, the semiconductor element 50 includes an element substrate 51, an electrode pad 52, an insulating film 53, a protective film 54, and the mounting electrode 55. The electrode pad 52 is made of, for example, Al (aluminum). The insulating film 53 covers a surface of the element substrate 51 and a peripheral edge of the electrode pad 52. The insulating film 53 is made of, for example, SiN. The protective film 54 covers a surface of the insulating film 53 and a portion of the electrode pad 52, and exposes a portion of the surface of the electrode pad 52 as a connection terminal. The protective film 54 is made of, for example, a polyimide resin.

The mounting electrode 55 is connected to a connection terminal, which is an exposed portion of the electrode pad 52. The mounting electrode 55 includes a metal layer 56, a conductive layer 57, and a barrier layer 58. The metal layer 56 is formed so as to cover the exposed portion of the electrode pad 52 and an end portion of the opening of the protective film 54 that exposes the electrode pad 52. The metal layer 56 is made of, for example, Ti/Cu and is formed as a seed layer forming the conductive layer 32.

The conductive layer 57 is formed so as to cover the lower surface of the metal layer 56. The conductive layer 32 is made of, for example, Cu or a Cu alloy. The barrier layer 58 is formed to cover the lower surface of the conductive layer 57. The barrier layer 58 includes Ni, an alloy containing Ni, and a plurality of metal layers containing Ni. As the barrier layer 58, for example, Ni, Pd, Au, an alloy containing two or more of these metals, or the like may be used. The lower surface of the barrier layer 58 is a lower surface of the mounting electrode 55 and is a connection surface of the semiconductor element 50. This connection surface faces the upper surface 441 of the solder layer 44 of the bonding portion 40 and is in contact with the upper surface 441. The mounting electrode 55 of the semiconductor element 50 is connected to the bonding portion 40, whereby the semiconductor element 50 is mounted on the substrate 10.

As shown in FIG. 1, the sealing resin 60 is formed so as to be in contact with the substrate main surface 101 of the substrate 10 and to cover the semiconductor element 50. More specifically, the sealing resin 60 covers the element main surface 501, the element back surface 502, and the element side surface 503 of the semiconductor element 50. Further, in the first embodiment, the sealing resin 60 covers the main surface wiring 21 and the bonding portion 40.

The sealing resin 60 overlaps the substrate 10 when viewed from the thickness direction z. The sealing resin 60 has a resin upper surface 601 facing the same direction as the substrate main surface 101 of the substrate 10 and a resin side surface 603 facing the same direction as the substrate side surface 103.

The sealing resin 60 is made of, for example, a resin having electrical insulation properties. As this resin, for example, a synthetic resin mainly containing an epoxy resin may be used. The sealing resin 60 is colored, for example, in black.

The external conductive film 70 is formed on the substrate back surface 102 of the substrate 10. The external conductive film 70 is formed so as to cover the lower surface 222 of the through-wiring 22. The external conductive film 70 becomes an external connection terminal of the semiconductor device A10. The external conductive film 70 includes, for example, a plurality of metal layers laminated on each other. Examples of the metal layers may include a Ni layer, a Pd (palladium) layer, and an Au (gold) layer. The material of the external conductive film 70 is not particularly limited, but the external conductive film 70 may be, for example, formed by laminating a Ni layer and an Au layer, or may be Sn.

Manufacturing Process

Next, an example of a method of manufacturing the semiconductor device A10 according to the first embodiment will be described. FIGS. 4 to 11 are cross-sectional views for explaining a manufacturing process of the semiconductor device A10 according to the first embodiment. FIGS. 4 to 11 show portions related to one semiconductor device A10. In FIGS. 4 to 11, two broken lines indicate a range that becomes one semiconductor device A10. Definitions of directions shown in these figures are the same as the definitions of the directions shown in FIGS. 1 and 2.

Figure 4:
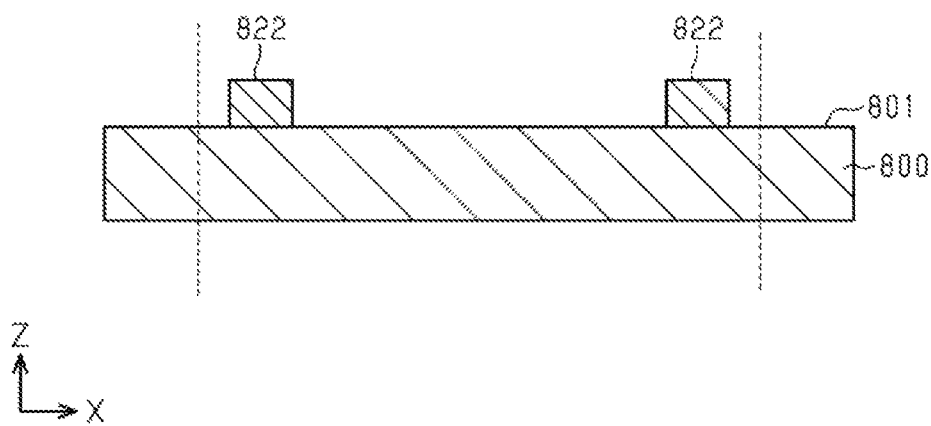
FIG. 4 is a schematic cross-sectional view for explaining a manufacturing process of the semiconductor device according to the first embodiment.

First, the manufacturing process of the semiconductor device A10 will be described, and then the manufacturing process of the bonding portion 40 will be described. As shown in FIG. 4, a support substrate 800 is provided. The support substrate 800 is made of, for example, a single crystal material of Si. A substrate made of a synthetic resin material such as an epoxy resin may be used as the support substrate 800. Terminal pillars 822 are formed on an upper surface 801 of the support substrate 800. The terminal pillars 822 are made of, for example, Cu or a Cu alloy.

Formation of the terminal pillars 822 includes, for example, a process of forming a seed layer, a process of forming a mask on the seed layer by photolithography, and a process of forming the terminal pillar 822 in contact with the seed layer. For example, the seed layer is formed on the upper surface of the support substrate 800 by a sputtering method. Next, the seed layer is covered with, for example, a photosensitive resist layer, and the resist layer is exposed and developed to form a mask having an opening. Next, the terminal pillars 822 are formed by precipitating plating metal on a surface of the seed layer exposed from the mask by an electrolytic plating method using the seed layer as a conductive path. After the formation of the terminal pillars 822, the mask is removed. The terminal pillars 822 may be formed of a Cu columnar material.

Figure 5:
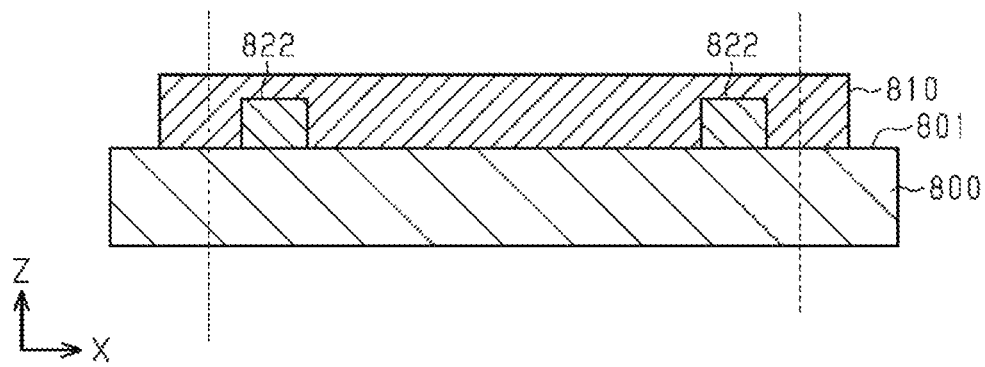
FIG. 5 is a schematic cross-sectional view for explaining a manufacturing process of the semiconductor device according to the first embodiment.

As shown in FIG. 5, a base material 810 that contacts the upper surface 801 of the support substrate 800 and covers the terminal pillars 822 is formed. The base material 810 is formed so as to cover the upper surfaces of the terminal pillars 822. As a material of the base material 810, material constituting the substrate 10 shown in FIG. 1 may be used. In the present embodiment, as material of the base material 810, a synthetic resin mainly containing an epoxy resin or the like may be used.

Figure 6:
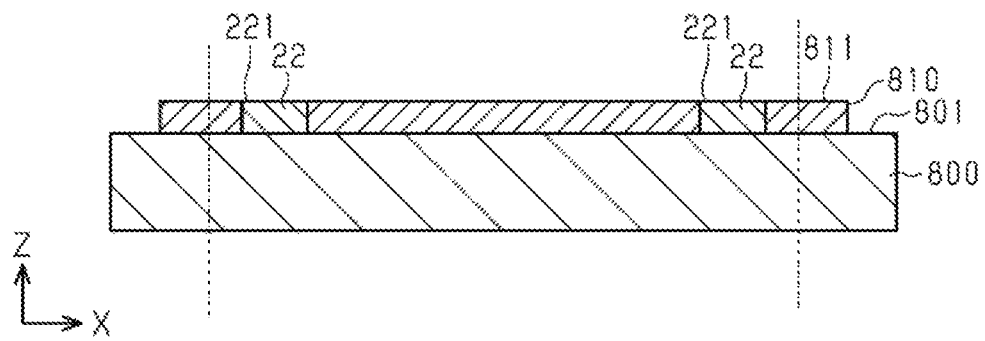
FIG. 6 is a schematic cross-sectional view for explaining a manufacturing process of the semiconductor device according to the first embodiment.

As shown in FIG. 6, the base material 810 and a portion of each of the terminal pillars 822 are ground to form the through-wiring 22 exposed on the upper surface 811 of the base material 810 and the upper surface 221 of the through-wiring 22. The base material 810 is to be the substrate 10 shown in FIG. 1. In grinding the base material 810, the base material 810 has the same thickness as the substrate 10.

Figure 7:
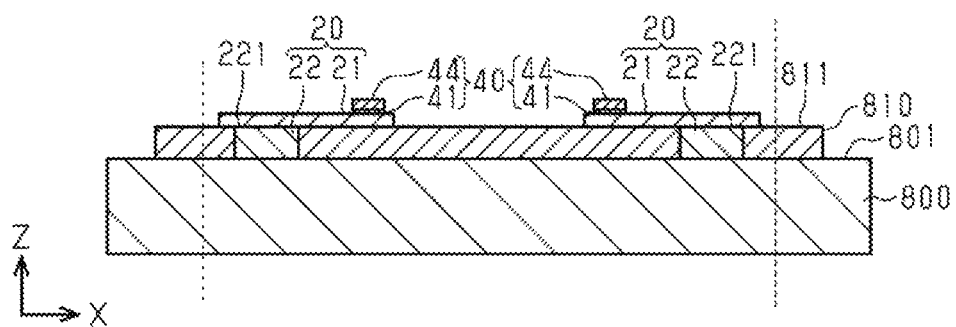
FIG. 7 is a schematic cross-sectional view for explaining a manufacturing process of the semiconductor device according to the first embodiment.

As shown in FIG. 7, the main surface wiring 21 is formed on the upper surface 811 of the base material 810 and the upper surface 221 of the through-wiring 22. Next, the bonding portion 40 is formed on the main surface wiring 21. As shown in FIG. 3, the main surface wiring 21 includes the metal layer 31, the conductive layer 32, and the first plating layer 33. The main surface wiring 21 is formed by a process of forming the metal layer 31, a process of forming a mask on the metal layer 31 by photolithography, a process of forming the conductive layer 32 in contact with the metal layer 31, a process of forming the conductive layer 32 in contact with the metal layer 31, and a process of forming the first plating layer 33 on the upper surface 321 of the conductive layer 32.

First, the metal layer 31 is formed by, for example, a sputtering method. For example, the metal layer 31 including a Ti layer and a Cu layer forms the Ti layer on the upper surface 811 of the base material 810 and the upper surface 221 of the through-wiring 22, and forms the Cu layer in contact with the Ti layer. Next, the metal layer 31 is covered with, for example, a photosensitive resist layer, and the resist layer is exposed and developed to form a mask having an opening. Next, the conductive layer 32 is formed by precipitating plating metal on the surface of the metal layer 31 exposed from the mask by, for example, an electrolytic plating method using the metal layer 31 as a conductive path. Next, the first plating layer 33 is formed by precipitating plating metal on the conductive layer 32 exposed from the mask by, for example, an electrolytic plating method. Through these processes, the main surface wiring 21 is formed. After forming the main surface wiring 21, the mask is removed. The wiring portion 20 shown in FIG. 1 is configured by the main surface wiring 21 and the through-wiring 22 thus formed.

Next, the bonding portion 40 is formed. As shown in FIG. 3, the bonding portion 40 includes the second plating layer 41 and the conductive layer 32. First, the second plating layer 41 is formed on the main surface wiring 21, and the conductive layer 32 is formed on the second plating layer 41. Details of the formation of the bonding portion 40 will be described later.

Figure 8:
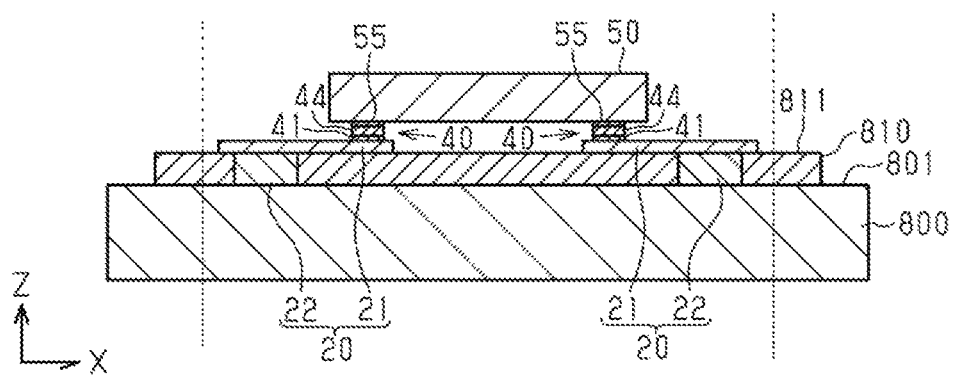
FIG. 8 is a schematic cross-sectional view for explaining a manufacturing process of the semiconductor device according to the first embodiment.

As shown in FIG. 8, the semiconductor element 50 is mounted. The mounting of the semiconductor element 50 is performed by flip chip bonding (FCB). For example, after a flux is applied to a part of the bonding portion 40 or the entire surface of the substrate 10, the semiconductor element 50 is placed on the bonding portion 40 using, for example, a flip chip bonder. Thus, the semiconductor element 50 is temporarily attached to the bonding portion 40. Thereafter, the semiconductor element 50 is connected to the bonding portion 40 by bringing the solder layer 44 of the bonding portion 40 into a liquid phase by reflow and solidifying the solder layer 44 by cooling.

Figure 9:
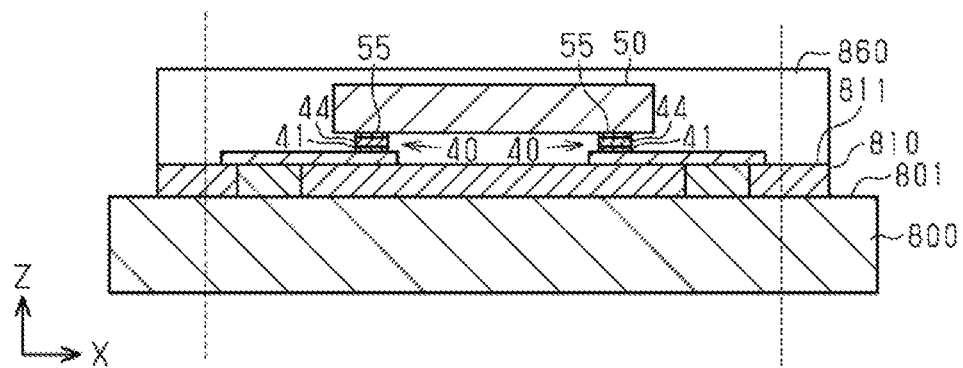
FIG. 9 is a schematic cross-sectional view for explaining a manufacturing process of the semiconductor device according to the first embodiment.

As shown in FIG. 9, a resin layer 860 covering the upper surface 811 of the base material 810 and the semiconductor element 50 is formed. The resin layer 860 is a member that becomes the sealing resin 60 shown in FIG. 1. The resin layer 860 is, for example, a synthetic resin mainly made of an epoxy resin. For example, the resin layer 860 is formed by transfer molding.

Figure 10:
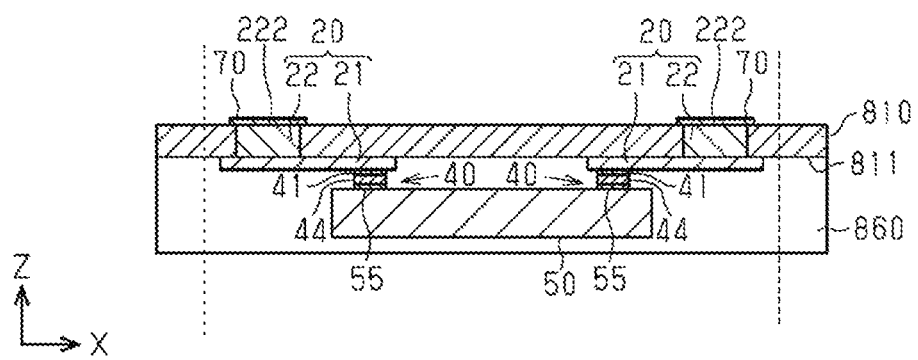
FIG. 10 is a schematic cross-sectional view for explaining a manufacturing process of the semiconductor device according to the first embodiment.

As shown in FIG. 10, the support substrate 800 shown in FIG. 9 is removed. FIG. 10 is an upside-down-inverted view of FIG. 9. For example, the support substrate 800 is removed by grinding. The base material 810 may be made thicker than the substrate 10 shown in FIG. 1, and in the grinding process of the support substrate 800, the base material 810 and the terminal pillars 822 may be ground, after the support substrate 800 is ground, to thereby make the thickness of the base material 810 equal to the thickness of the substrate 10. Alternatively, a method in which a separation film is formed in advance and the support substrate 800 is removed by a separation method may be used.

Next, the external conductive film 70 is formed on the surface of the through-wiring 22 (the lower surface 222 shown in FIG. 1) exposed from the base material 810. The external conductive film 70 is made of, for example, plating metal. For example, the external conductive film 70 is formed by precipitating plating metal, for example, Ni, Pd, and Au in this order by electroless plating. The structure and forming method of the external conductive film 70 are not particularly limited.

Figure 11:
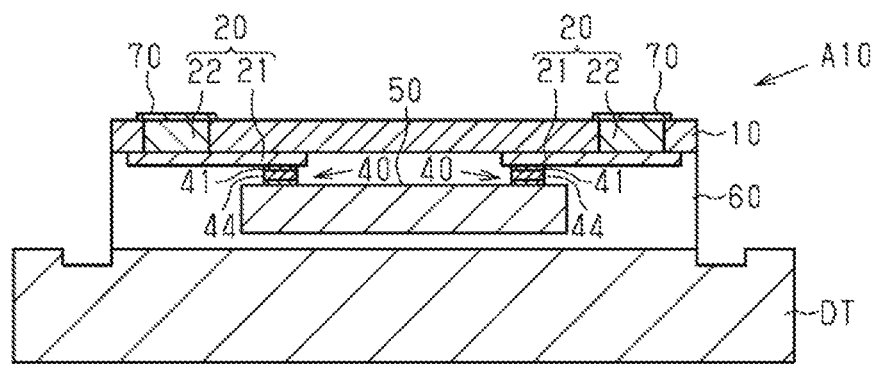
FIG. 11 is a schematic cross-sectional view for explaining a manufacturing process of the semiconductor device according to the first embodiment.
Figure 11:

As shown in FIG. 11, a dicing tape DT is attached to the lower surface of the resin layer 860, the base material 810 and the resin layer 860 are cut, and the semiconductor element 50 is divided into individual pieces. In the division, the base material 810 and the resin layer 860 are cut along a cutting line shown in FIG. 10 from the side of the base material 810 to the dicing tape DT using, for example, a dicing blade. The individual piece is a semiconductor device A10 including the substrate 10 and the sealing resin 60.

Through the above process, the semiconductor device A10 can be manufactured. Next, an example of a process of forming the bonding portion 40 on the main surface wiring 21 will be described with reference to FIGS. 12 to 15.

Figure 12:
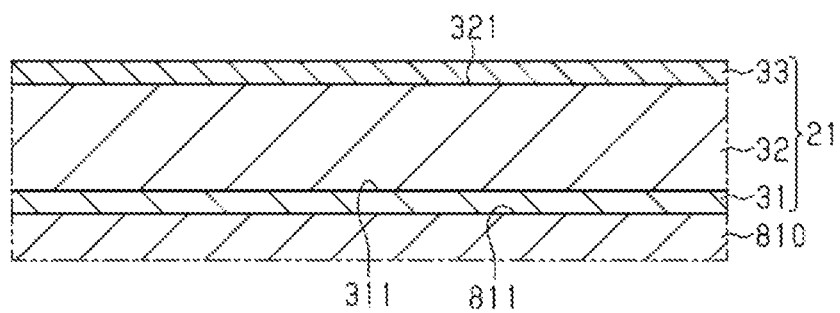
FIG. 12 is a schematic cross-sectional view for explaining a manufacturing process of a bonding portion according to the first embodiment.
Figure 12:

FIGS. 12 to 15 are cross-sectional views for explaining an example of a manufacturing process of the bonding portion 40. As shown in FIG. 12, the main surface wiring 21 includes the metal layer 31, the conductive layer 32, and the first plating layer 33, which are laminated on the upper surface 811 of the base material 810 that becomes the substrate 10. The metal layer 31, the first conductive layer 32, the first plating layer 33, and the second conductive layer 34 are laminated on the upper surface 811 of the base material 810 in this order. First, the metal layer 31 is formed by, for example, a sputtering method. When the metal layer 31 includes a Ti layer and a Cu layer laminated on each other, first, the Ti layer in contact with the upper surface 811 of the base material 810 is formed, and then the Cu layer in contact with the Ti layer is formed. Next, the conductive layer 32 is formed by, for example, an electrolytic plating method. In the electrolytic plating method, the conductive layer 32 is formed by depositing Cu as plating metal on the upper surface 311 of the metal layer 31 using the metal layer 31 as a conductive path and using the metal layer 31 as a seed layer. By forming a resist mask (not shown) on the upper surface 311 of the metal layer 31 serving as the seed layer, the conductive layer 32 and the next first plating layer 33 can be formed only in a portion to be the main surface wiring 21. Next, the first plating layer 33 is formed by, for example, an electrolytic plating method. In the electrolytic plating method, the first plating layer 33 is formed by precipitating Ni as plating metal on the upper surface 321 of the conductive layer 32 using the metal layer 31 and the conductive layer 32 as conductive paths and using the conductive layer 32 as a seed layer. After removing the above-described resist mask, the exposed metal layer 31 is removed by, for example, etching, whereby the main surface wiring 21 including the metal layer 31, the conductive layer 32, and the first plating layer 33 is obtained.

Figure 13:
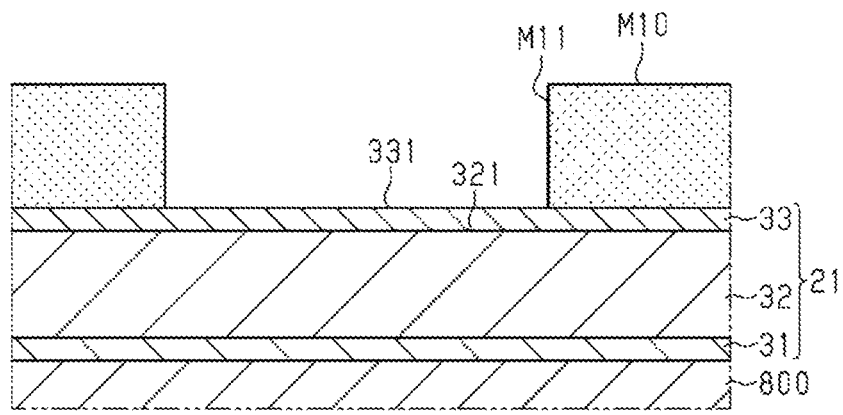
FIG. 13 is a schematic cross-sectional view for explaining a manufacturing process of a bonding portion according to the first embodiment.
Figure 13:

As shown in FIG. 13, a mask M10 is formed on the upper surface 331 of the first plating layer 33. The mask M10 is formed by, for example, photolithography using a photosensitive resist layer. The photosensitive resist layer is formed on the upper surface 331 of the first plating layer 33. The resist layer is formed by spray coating a liquid photoresist, for example. A film-shaped photoresist may be used. By exposing and developing the resist layer, the mask M10 having an opening M11 at a desired position is formed.

Figure 14:
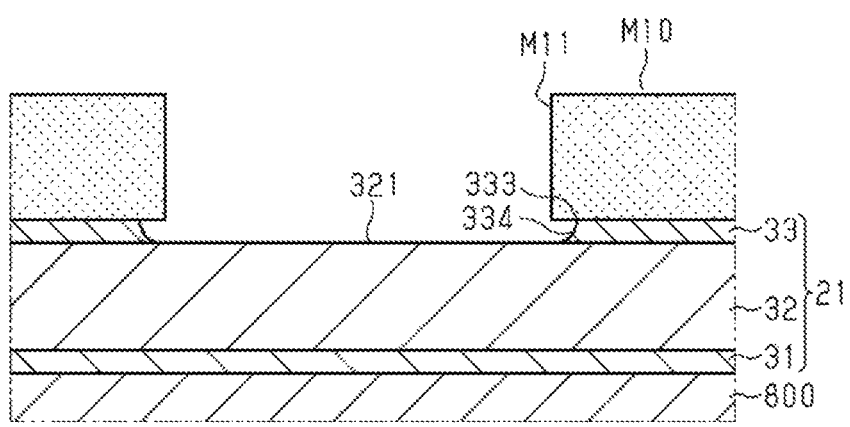
FIG. 14 is a schematic cross-sectional view for explaining a manufacturing process of a bonding portion according to the first embodiment.
Figure 14:

As shown in FIG. 14, a part of the first plating layer 33 exposed from the opening M11 of the mask M10 is removed to expose the upper surface 321 of the conductive layer 32. The first plating layer 33 exposed from the opening M11 of the mask M10 is removed by etching. The etching is, for example, wet etching. In wet etching, an etching solution for the first plating layer 33 containing Ni is used. In this etching, the etching proceeds isotropically with respect to the first plating layer 33, and a portion covered by the mask M10 is etched inward from the opening M11 of the mask M10. Then, the opening 333 is formed in the first plating layer 33 by this etching, and the inner wall surface 334 formed in the opening 333 becomes a curved surface that is concave toward the inside of the first plating layer 33. Further, since the etching proceeds isotropically from the upper surface 331 of the first plating layer 33, the inner wall surface 334 has a smaller diameter on the lower surface 332 side of the first plating layer 33 than on the upper surface 331 side of the first plating layer 33.

Figure 15:
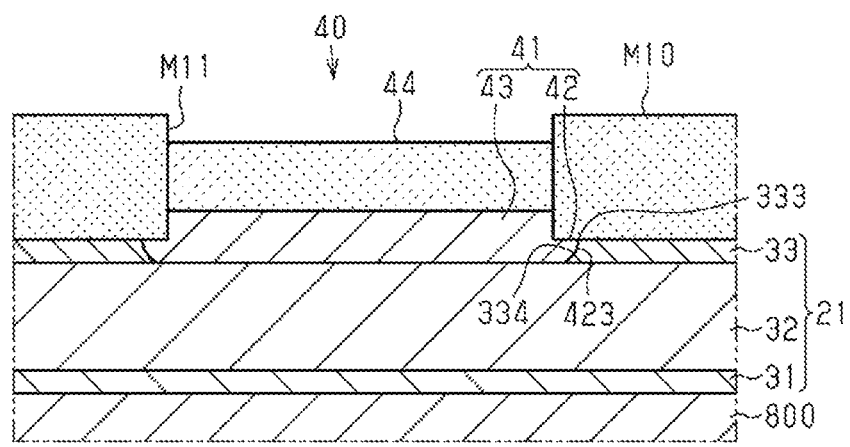
FIG. 15 is a schematic cross-sectional view for explaining a manufacturing process of a bonding portion according to the first embodiment.
Figure 15:
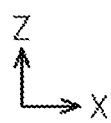

As shown in FIG. 15, the second plating layer 41 and the solder layer 44 are formed. The second plating layer 41 may be formed by, for example, an electrolytic plating method. The second plating layer 41 is formed by precipitating Ni as plating metal on the upper surface 321 of the conductive layer 32 and the inner wall surface 334 of the first plating layer 33 exposed from the mask M10 by the electrolytic plating method using the main surface wiring 21 as a conductive path. The crystal state of the second plating layer 41 thus formed is discontinuous with respect to the crystal state of the first plating layer 33. Next, the solder layer 44 is formed by precipitating an alloy containing Sn as plating metal on the upper surface 411 of the second plating layer 41 exposed from the mask M10 by an electrolytic plating method. Then, the mask M10 is removed.

Operation

Next, an operation of the semiconductor device A10 according to the first embodiment will be described. The semiconductor device A10 includes the substrate 10 having the substrate main surface 101, and the wiring portion 20 formed on the substrate main surface 101. The wiring portion 20 includes the conductive layer 32 formed on the substrate main surface 101 of the substrate 10, and the first plating layer 33 provided on the upper surface 321 of the conductive layer 32 and having an oxide film formed thereon. The bonding portion 40 for mounting the semiconductor element 50 is formed on the wiring portion 20. The bonding portion 40 includes the second plating layer 41 laminated on the conductive layer 32, and the solder layer 44 laminated on the second plating layer 41. The semiconductor element 50 is connected to the wiring portion 20 via the solder layer 44 and the second plating layer 41 of the bonding portion 40.

When the semiconductor element 50 is mounted on the substrate 10, the solder layer 44 included in the bonding portion 40 is in a liquid phase due to heating in a reflow process and thus has a high fluidity. The first plating layer 33 of the wiring portion 20 and the second plating layer 41 of the bonding portion 40 are made of the same material, and have an oxide film formed thereon. The solder layer 44 in the liquid phase is unlikely to wet the oxide film formed on the first plating layer 33 and the second plating layer 41. Therefore, even if the solder layer 44 is brought into the liquid phase due to the heating of the reflow process, it stays on the second plating layer 41. In this manner, the outflow of the solder layer 44 can be suppressed.

In addition, in the semiconductor device A10 according to the first embodiment, since the solder layer 44 in the liquid phase can be prevented from flowing out in an unintended direction, a short-circuit failure can be suppressed. In the case where the upper surface of the wiring portion 20 is the conductive layer 32 made of Cu or a Cu alloy, an oxide film formed by natural oxidation on the exposed surface is removed by flux. The oxide film becomes thin even if it is not completely removed by the flux. As described above, in the wiring portion where the surface of Cu is exposed, the solder layer 44, which is in the liquid phase due to the heating in the reflow process, easily flows out from above the second plating layer 41.

In a semiconductor device including a semiconductor element connected to a substrate by a plurality of bonding portions, the height of the bonding portions may vary due to the flow of solder. Such a variation in the height of the bonding portions causes inclination of the semiconductor element mounted on the substrate. When the semiconductor element 50 is, for example, a light emitting element, a Hall element that detects a magnetic field, or the like, the inclination of the semiconductor element 50 causes a decrease in the performance of the semiconductor device A10 and an occurrence of defective products.

On the other hand, in the semiconductor device A10 according to the first embodiment, an oxide film is formed on the upper surface 211 of the main surface wiring 21 constituting the wiring portion 20, that is, on the upper surface 331 of the first plating layer 33, by natural oxidation. In the first plating layer 33 made of Ni, the oxide film formed on the upper surface 331 is difficult to be removed by the flux applied in the manufacturing process. Therefore, even when a flux is used in the mounting process of the semiconductor element 50, the outflow of the solder layer 44 can be suppressed.

Further, in the plurality of bonding portions 40, since the solder layer 44 of each bonding portion 40 stays on the second plating layer 41, the inclination of the semiconductor element 50 can be suppressed. Therefore, it is possible to suppress a decrease in the function of the semiconductor device A10. For example, when the semiconductor element 50 is a Hall element, inclination of a magneto-sensitive surface of the Hall element can be suppressed, and a decrease in detection of a magnetic field can be suppressed. When the semiconductor element 50 is a light emitting element such as an LED, inclination of an irradiation direction can be prevented, and the emission intensity in a predetermined direction can be suppressed from decreasing.

In addition, in the plurality of bonding portions 40, since the solder layer 44 of each bonding portion 40 stays on the second plating layer 41, poor connection of the semiconductor element to the substrate 10 can be suppressed. For example, when the solder layer 44 begins to flow out at the bonding portion 40, the wiring portion 20 of the substrate 10 and the semiconductor element 50 may not be connected by the solder layer 44. On the other hand, in the first embodiment, since the outflow of the solder layer 44 is suppressed, the wiring portion 20 of the substrate 10 and the semiconductor element 50 are connected by the plurality of bonding portions 40, and poor connection of the semiconductor element to the substrate 10 can be suppressed.

As a first comparative example for the semiconductor device A10 according to the first embodiment, for example, in a semiconductor device in which a Cu pillar is formed on the upper surface 331 of the first plating layer 33, due to the oxide film on the upper surface of the first plating layer 33, sufficient adhesion may not be obtained between the Cu pillar and the first plating layer 33. Therefore, in a process such as peeling of a resist mask for forming the Cu pillar, there is a possibility that the Cu pillar having insufficient adhesion may peel off from the upper surface 331 of the first plating layer 33.

On the other hand, in the semiconductor device A10 according to the first embodiment, the second plating layer 41 has the filling portion 42 filling the opening 333 of the first plating layer 33. The filling portion 42 is connected to the conductive layer 32 of the wiring portion 20 in the opening 333 of the first plating layer 33. For this reason, adhesion between the wiring portion 20 and the bonding portion 40 may be improved, thereby preventing the bonding portion 40 from peeling off.

As a second comparative example for the semiconductor device A10 according to the first embodiment, for example, in a semiconductor device in which the second plating layer 41 is formed on the upper surface 331 of the first plating layer 33, due to the oxide film of the first plating layer 33, an ungrown portion may occur in the second plating layer. Due to the ungrown portion of the second plating layer, a resistance value between the solder layer 44 and the first plating layer 33, that is, between the semiconductor element 50 and the wiring portion 20, increases.

On the other hand, in the semiconductor device A10 according to the first embodiment, the second plating layer 41 is formed on the upper surface 321 of the conductive layer 32 exposed by the opening 333 of the first plating layer 33. For this reason, the second plating layer 41 can be entirely grown in the opening 333 of the first plating layer 33. Therefore, it is possible to suppress generation of an ungrown portion of the second plating layer 41, suppress an increase in resistance of the second plating layer 41, and suppress an increase in a resistance between the semiconductor element 50 and the wiring portion 20.

In the semiconductor device A10 according to the second comparative example, due to the oxide film of the first plating layer 33, as in the first comparative example, sufficient adhesion may not be obtained between the first plating layer 33 and the second plating layer 41, and the bonding portion 40 including the second plating layer 41 may peel off from the upper surface 331 of the first plating layer 33.

In contrast, in the semiconductor device A10 according to the first embodiment, the second plating layer 41 is formed on the upper surface 321 of the conductive layer 32 exposed through the opening 333 of the first plating layer 33. That is, since no oxide film is interposed between the first plating layer 33 and the conductive layer 32 and between the first plating layer 33 and the inner wall surface 334 of the opening 333 of the second plating layer 41, the adhesion between the wiring portion 20 and the bonding portion 40 can be improved, thereby preventing the bonding portion 40 from peeling off.

In the semiconductor device A10 according to the first embodiment, the wiring portion 20 includes the metal layer 31, the conductive layer 32, and the first plating layer 33. The bonding portion formed on the wiring portion 20 includes the second plating layer 41 connected to the conductive layer 32, and the solder layer 44 on the second plating layer 41. The conductive layer 32 contains Cu, and the first plating layer 33 and the second plating layer 41 are made of Ni. The solder layer 44 contains Sn. For this reason, diffusion of Sn from the solder layer 44 to the conductive layer 32 is suppressed by the second plating layer 41.

As described above, the first embodiment has the following effects.

(1-1) The semiconductor device A10 includes the substrate 10 having the substrate main surface 101, and the wiring portion 20 formed on the substrate main surface 101. The wiring portion 20 includes the conductive layer 32 formed on the substrate main surface 101 of the substrate 10, and the first plating layer 33 provided on the upper surface 321 of the conductive layer 32 and having the oxide film formed thereon. The bonding portion 40 for mounting the semiconductor element 50 is formed on the wiring portion 20. The bonding portion 40 includes the second plating layer 41 laminated on the conductive layer 32, and the solder layer 44 laminated on the second plating layer 41. The semiconductor element 50 is connected to the wiring portion 20 via the solder layer 44 and the second plating layer 41 of the bonding portion 40.

When the semiconductor element 50 is mounted on the substrate 10, the solder layer 44 included in the bonding portion 40 is in the liquid phase due to the heating in the reflow process and thus has a high fluidity. The first plating layer 33 of the wiring portion 20 and the second plating layer 41 of the bonding portion 40 are made of the same material, and the oxide film is formed. The solder layer 44 in the liquid phase is unlikely to wet the oxide film formed on the first plating layer 33 and the second plating layer 41. Therefore, even if the solder layer 44 is brought into the liquid phase by the heating of the reflow process, it stays on the second plating layer 41. In this manner, the outflow of the solder layer 44 can be suppressed.

(1-2) In the semiconductor device A10 according to the first embodiment, since the solder layer 44 in the liquid phase can be prevented from flowing out in the unintended direction, a short-circuit failure can be suppressed.

(1-3) In the plurality of bonding portions 40, since the solder layer 44 of each bonding portion 40 stays on the second plating layer 41, it is possible to suppress a variation in the height of the bonding portion 40. Therefore, the inclination of the semiconductor element 50 can be suppressed.

(1-4) In the plurality of bonding portions 40, since the solder layer 44 of each bonding portion 40 stays on the second plating layer 41, poor connection of the semiconductor element 50 to the substrate 10 can be suppressed.

(1-5) The second plating layer 41 includes the filling portion 42 filling the opening 333 of the first plating layer 33. The filling portion 42 is connected to the conductive layer 32 of the wiring portion 20 in the opening 333 of the first plating layer 33. For this reason, the adhesion between the wiring portion 20 and the bonding portion 40 may be improved, thereby suppressing the bonding portion 40 from peeling off.

(1-6) In the semiconductor device A10 according to the first embodiment, the second plating layer 41 is formed on the upper surface 321 of the conductive layer 32 exposed by the opening 333 of the first plating layer 33. For this reason, the second plating layer 41 can be entirely grown in the opening 333 of the first plating layer 33. Therefore, it is possible to suppress the generation of an ungrown portion of the second plating layer 41, suppress the increase in resistance of the second plating layer 41, and suppress the increase in resistance between the semiconductor element 50 and the wiring portion 20.

(1-7) In the semiconductor device A10 according to the first embodiment, the wiring portion 20 includes the metal layer 31, the conductive layer 32, and the first plating layer 33. The bonding portion formed on the wiring portion 20 includes the second plating layer 41 connected to the conductive layer 32, and the solder layer 44 formed on the second plating layer 41. The conductive layer 32 contains Cu, and the first plating layer 33 and the second plating layer 41 are made of Ni. The solder layer 44 contains Sn. For this reason, the diffusion of Sn from the solder layer 44 to the conductive layer 32 is suppressed by the second plating layer 41.

Modification of the First Embodiment

Figure 16:
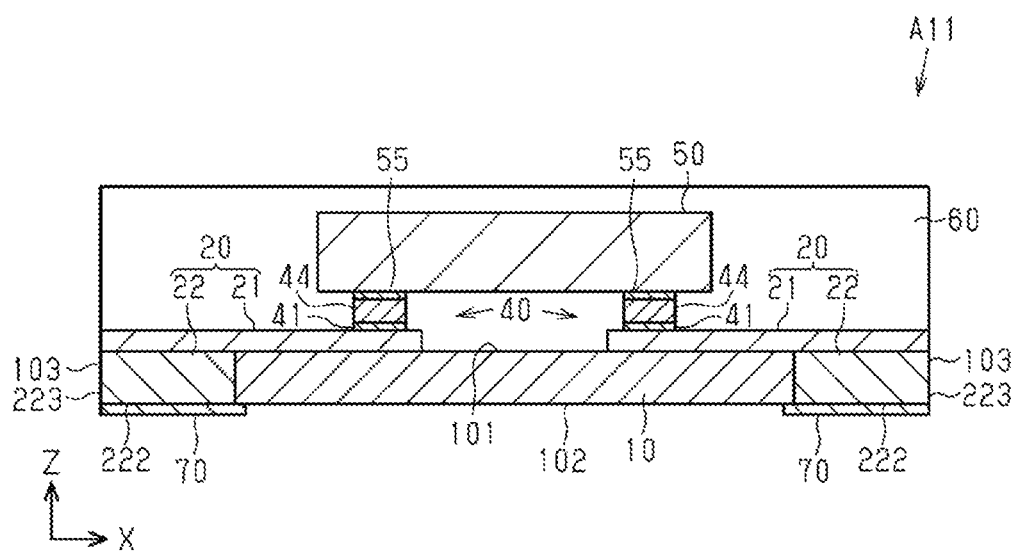
FIG. 16 is a schematic cross-sectional view showing a semiconductor device according to a modification of the first embodiment.

A semiconductor device A11 shown in FIG. 16 includes a substrate 10, a wiring portion 20, a bonding portion 40, a semiconductor element 50, a sealing resin 60, and an external conductive film 70. The wiring portion 20 includes a main surface wiring 21 formed on a substrate main surface 101 of the substrate 10, and a through-wiring 22 penetrating the substrate 10.

The through-wiring 22 extends to a substrate side surface 103 of the substrate 10. That is, a side surface 223 of the through-wiring 22 is flush with the substrate side surface 103 of the substrate 10. The external conductive film 70 extends to the substrate side surface 103 of the substrate 10. Therefore, a lower surface 222 of the through-wiring 22 is exposed on a substrate back surface 102 of the substrate 10, and the side surface 223 of the through-wiring 22 is exposed on the substrate side surface 103 of the substrate 10. The external conductive film 70 is formed so as to cover the lower surface 222 of the through-wiring 22. Also in such a semiconductor device A11, the same effects as in the first embodiment can be obtained.

Figure 17:
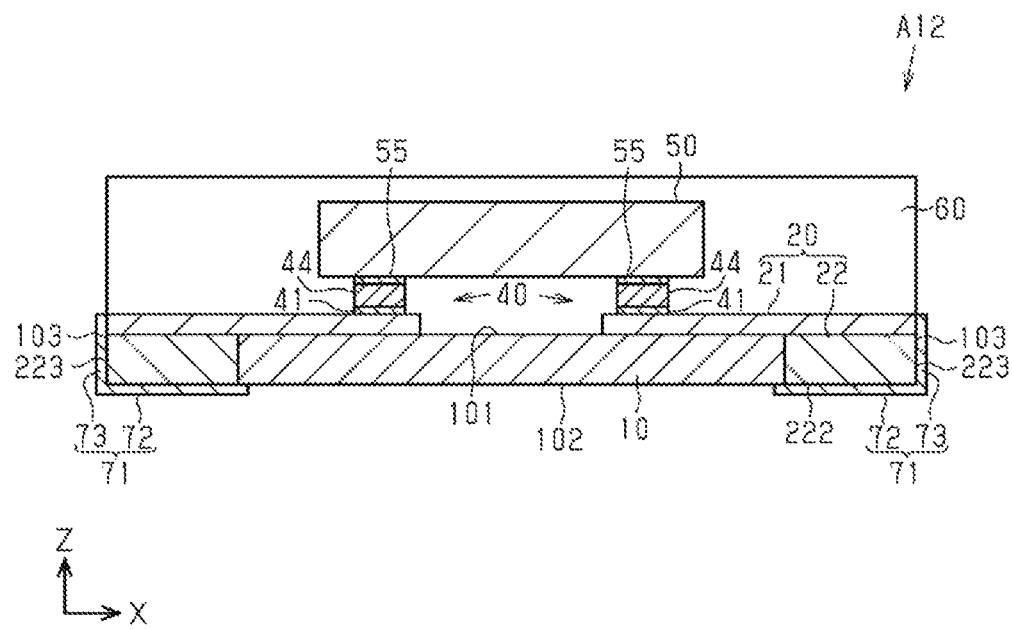
FIG. 17 is a schematic cross-sectional view showing a semiconductor device according to a modification of the first embodiment.

A semiconductor device A12 shown in FIG. 17 includes a substrate 10, a wiring portion 20, a bonding portion 40, a semiconductor element 50, a sealing resin 60, and an external conductive film 71. The wiring portion 20 includes a main surface wiring 21 formed on a substrate main surface 101 of the substrate 10, and a through-wiring 22 penetrating the substrate 10.

The through-wiring 22 extends to a substrate side surface 103 of the substrate 10. That is, a side surface 223 of the through-wiring 22 is flush with the substrate side surface 103 of the substrate 10. Therefore, a lower surface 222 of the through-wiring 22 is exposed on the substrate back surface 102 of the substrate 10, and the side surface 223 of the through-wiring 22 is exposed on the substrate side surface 103 of the substrate 10.

The external conductive film 71 is formed so as to cover the through-wiring 22 exposed from the substrate 10. The external conductive film 71 includes a lower conductive film 72 covering the lower surface 222 of the through-wiring 22, and a side conductive film 73 covering the side surface 223 of the through-wiring 22. The external conductive film 71 including the lower conductive film 72 and the side conductive film 73 becomes an external connection terminal of the semiconductor device A10, similar to the external conductive film 70 of the first embodiment. The external conductive film 71 includes, for example, a plurality of metal layers laminated on each other. Examples of the metal layers may include a Ni layer, a Pd (palladium) layer, and an Au (gold) layer. The material of the external conductive film 71 is not particularly limited. For example, the external conductive film 71 may be formed by laminating a Ni layer and an Au layer, or may be Sn.

In the semiconductor device A12, when the semiconductor device A12 is mounted on a mounting board, solder for connecting the external conductive film 71 to a connection pad of the mounting board is interposed between the lower conductive film 72 and the connection pad, and also is attached to the side conductive film 73. In other words, the solder in a liquid phase by a reflow process climbs up the side conductive film 73 to form a solder fillet between the side conductive film 73 and the connection pad. Although a solder fillet is also formed in the semiconductor device A11 shown in FIG. 16, the solder fillet is formed more easily in the semiconductor device A12 according to this modification. With this solder fillet, the bonding area of the solder increases, thereby further increasing a connection strength. Further, a state of soldering of the semiconductor device A12 can be confirmed from the outside by the solder fillet.

Figure 18:
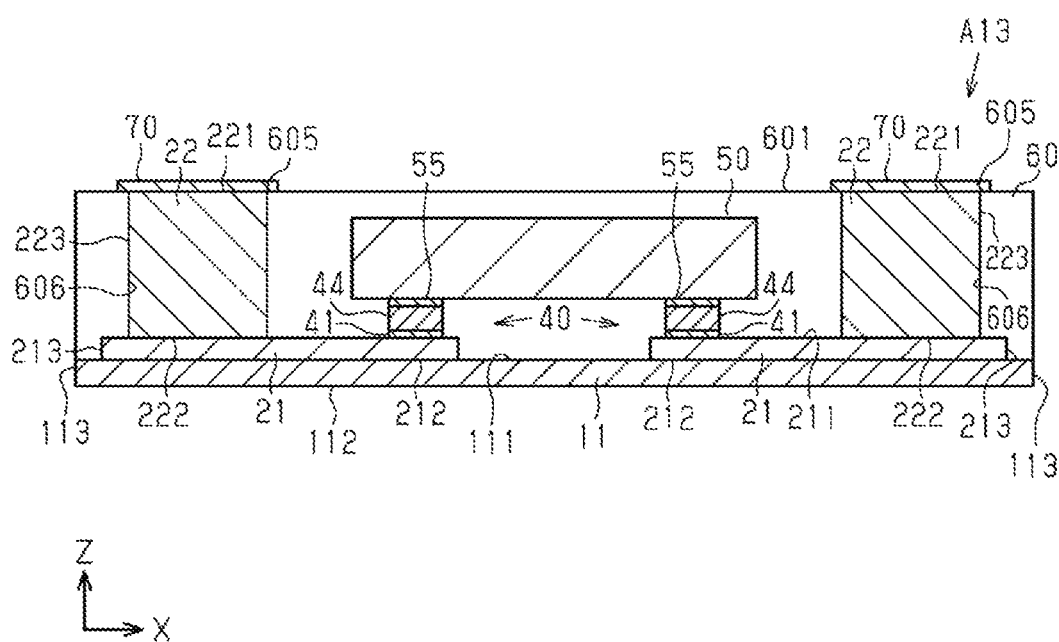
FIG. 18 is a schematic cross-sectional view showing a semiconductor device according to a modification of the first embodiment.

A semiconductor device A13 shown in FIG. 18 includes a substrate 11, a wiring portion 20, a bonding portion 40, a semiconductor element 50, a sealing resin 60, and an external conductive film 70. The substrate 11 has a thin plate shape without any through-holes formed therein. The substrate 11 has a substrate main surface 111, a substrate back surface 112, and a plurality of substrate side surfaces 113. The substrate main surface 111 and the substrate back surface 112 face opposite sides in the thickness direction z. The substrate main surface 111 and the substrate back surface 112 are flat. As a material of the substrate 11, for example, a synthetic resin mainly made of an epoxy resin or the like, ceramics, glass, a semiconductor material such as Si, or the like may be used. In the case of the substrate 11 made of a semiconductor material such as Si, an insulating layer covering the substrate main surface 111 is provided. As the insulating layer, for example, an oxide film such as $SiO_2$ or a resin film such as polyimide is used.

The wiring portion 20 has a main surface wiring 21 and a through-wiring 22. The main surface wiring 21 is formed on the substrate main surface 111 of the substrate 11. An upper surface 211 of the main surface wiring 21 faces the same direction as the substrate main surface 111 of the substrate 11. A lower surface 212 of the main surface wiring 21 faces the same direction as the substrate back surface 112 of the substrate 11 and faces the substrate main surface 111 of the substrate 11. A side surface 213 of the main surface wiring 21 faces the same direction as the substrate side surface 113 of the substrate 11.

The sealing resin 60 is formed so as to be in contact with the substrate main surface 111 of the substrate 11 and to cover the semiconductor element 50. The sealing resin 60 has a plurality of through-holes 605 penetrating the sealing resin 60 in the thickness direction z. The through-holes 605 extend from a resin upper surface 601 of the sealing resin 60 to the upper surface 211 of the main surface wiring 21. The shape of the through-holes 605 is, for example, a rectangular shape when viewed from the thickness direction z. Note that the shape of the through-holes 605 may be circular or polygonal.

The through-wirings 22 are arranged in the through-holes 605. Each through-wiring 22 includes an upper surface 221, a lower surface 222, and a plurality of side surfaces 223. The upper surface 221 of the through-wiring 22 is flush with the resin upper surface 601 of the sealing resin 60. The upper surface 221 of the through-wiring 22 is exposed from the sealing resin 60. The lower surface 222 of the through-wiring 22 is in contact with the upper surface 211 of the main surface wiring 21. The side surface 223 of the through-wiring 22 is in contact with an inner wall surface 606 of the through-hole 605 of the sealing resin 60.

The external conductive film 70 is formed on the resin upper surface 601 of the sealing resin 60. The external conductive film 70 is formed so as to cover the exposed upper surface 221 of the through-wiring 22. The external conductive film 70 becomes an external connection terminal of the semiconductor device A13.

The semiconductor device A13 is mounted on the mounting substrate with the external conductive film 70 facing the mounting substrate, that is, with an element main surface 501 of the semiconductor element 50 facing in a direction opposite to the mounting substrate. In the semiconductor device A13, the same effects as in the first embodiment can be obtained. Further, in the semiconductor device A13, since the thickness of the substrate 11 can be smaller than that of the substrate 10 of the semiconductor device A10 according to the first embodiment, a size of the semiconductor device A13 can be reduced.

Second Embodiment

A semiconductor device A20 according to a second embodiment will be now described. In the second embodiment, the same or similar constituent members as those of the semiconductor device A10 according to the first embodiment are denoted by the same reference numerals, and some or all of the explanation of the members will be omitted.

Figure 19:
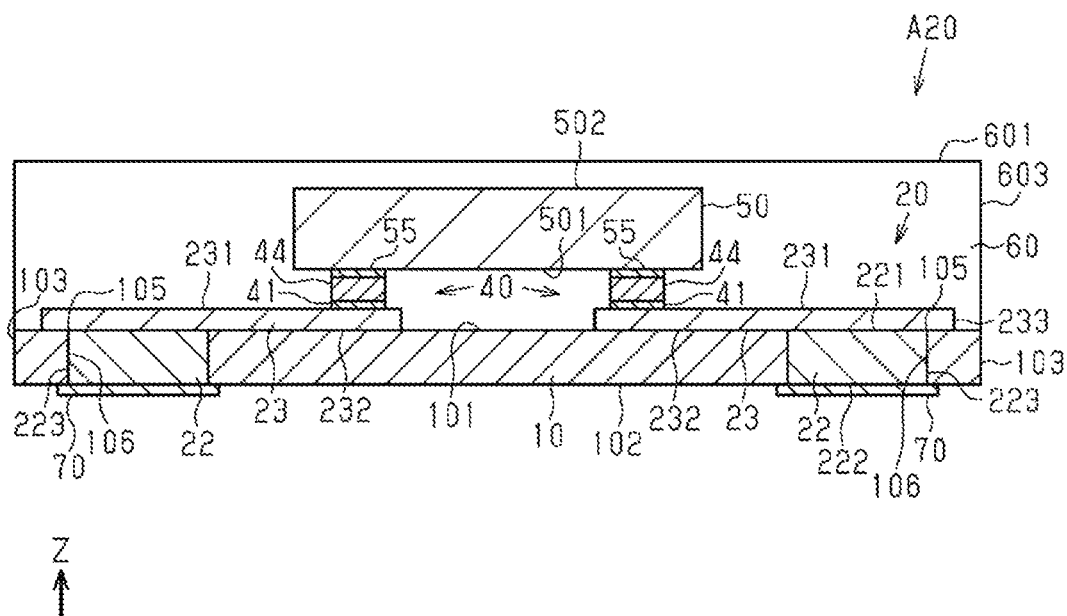
FIG. 19 is a schematic cross-sectional view showing a semiconductor device according to a second embodiment of the present disclosure.
Figure 20:
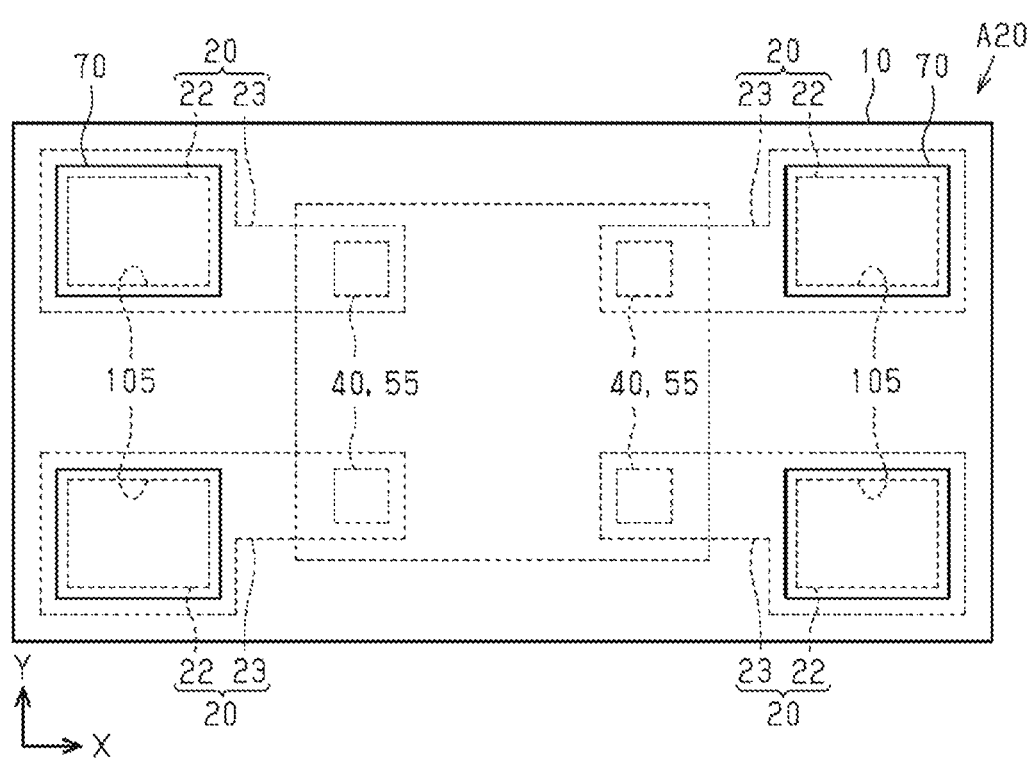
FIG. 20 is a schematic plan view showing the semiconductor device according to the second embodiment.

As shown in FIGS. 19 and 20, the semiconductor device A20 includes a substrate 10, a wiring portion 20, a bonding portion 40, a semiconductor element 50, a sealing resin 60, and an external conductive film 70. The wiring portion 20 includes a main surface wiring 23 and a through-wiring 22. The main surface wiring 23 has an upper surface 231, a lower surface 232, and a side surface 233.

Figure 21:
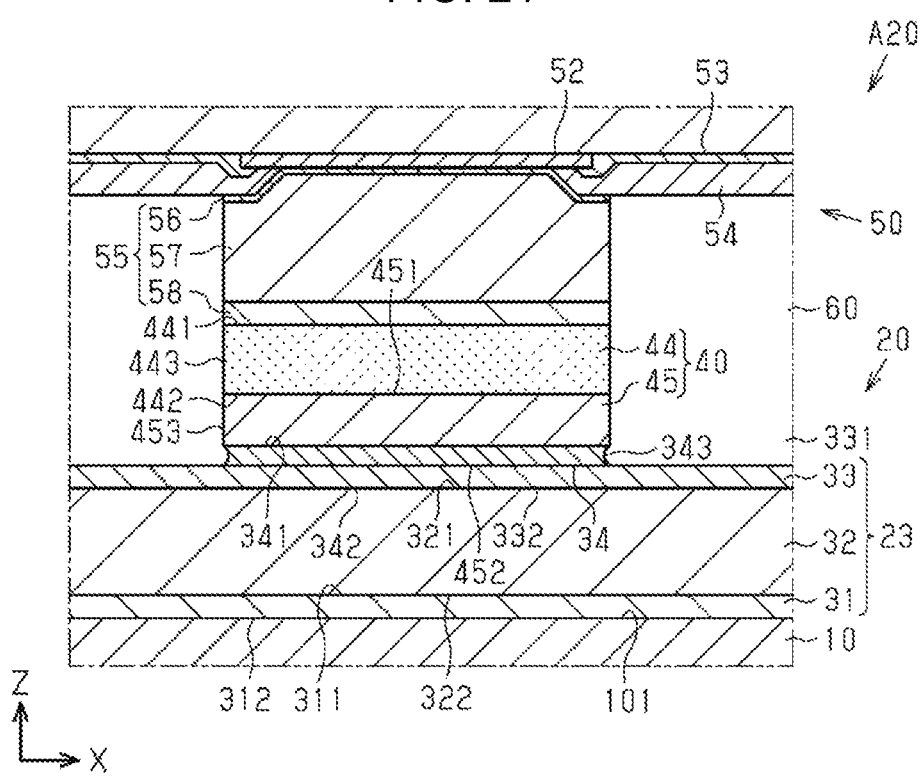
FIG. 21 is a partially enlarged schematic cross-sectional view of the semiconductor device according to the second embodiment.

FIG. 19 is a cross-sectional view of the semiconductor device A20 according to the second embodiment. FIG. 20 is a schematic plan view of the semiconductor device A20 as viewed from the substrate 10 side. For convenience of understanding, in FIG. 21, each member provided in the semiconductor device A20 is indicated by a broken line so as to appear transparent through the substrate 10 and the sealing resin 60 and show a positional relationship between the members. FIG. 21 is a partially enlarged cross-sectional view of the semiconductor device A20, showing the main surface wiring 23, the bonding portion 40, and a portion of the semiconductor element 50.

As shown in FIG. 21, the main surface wiring 23 includes a metal layer 31, a first conductive layer 32, a first plating layer 33, and a second conductive layer 34. The metal layer 31, the first conductive layer 32, the first plating layer 33, and the second conductive layer 34 are laminated on a substrate main surface 101 of the substrate 10 in this order. A thickness of the first plating layer 33 is, for example, not less than 1 µm and not more than 3 µm.

The second conductive layer 34 is formed on an upper surface 331 of the first plating layer 33. The second conductive layer 34 is formed so as to cover a portion of the upper surface 331 of the first plating layer 33. A shape and an arrangement position of the second conductive layer 34 correspond to a mounting electrode 55 of the semiconductor element 50.

The second conductive layer 34 has an upper surface 341, a lower surface 342, and a plurality of side surfaces 343. The upper surface 341 and the lower surface 342 face opposite sides in the thickness direction z. The plurality of side surfaces 343 are sandwiched between the upper surface 341 and the lower surface 342. Each side surface 343 faces one of the first direction x and the second direction y. Each side surface 343 is concave toward the inside of the second conductive layer 34.

The bonding portion 40 is formed on the upper surface 341 of the second conductive layer 34. The bonding portion 40 includes a second plating layer 45 and a solder layer 44. The second plating layer 45 of the second embodiment includes an upper surface 451, a lower surface 452, and a plurality of side surfaces 453. The upper surface 451 and the lower surface 452 face opposite sides in the thickness direction z. The upper surface 451 faces the same direction as the upper surface 341 of the second conductive layer 34. The lower surface 452 faces and is in contact with the upper surface 341 of the second conductive layer 34. Each side surface 453 is sandwiched between the upper surface 451 and the lower surface 452. Each side surface 453 is flat. Each side surface 453 intersects with the upper surface 451 and the lower surface 452. The second plating layer 45 and the second conductive layer 34 overlap each other when viewed from the thickness direction z.

The solder layer 44 is formed on the upper surface 451 of the second plating layer 45. The solder layer 44 includes an upper surface 441, a lower surface 442, and a plurality of side surfaces 443. The upper surface 441 and the lower surface 442 face opposite sides in the thickness direction z. The upper surface 441 faces in the same direction as the upper surface 451 of the second plating layer 45. The lower surface 442 faces and is in contact with the upper surface 451 of the second plating layer 45. The solder layer 44 and the second plating layer 45 overlap each other when viewed from the thickness direction z.

Manufacturing Process

An example of a method for manufacturing the bonding portion 40 of the second embodiment will be now described. In the second embodiment, a process of manufacturing the semiconductor device A20 is substantially the same as the process of manufacturing the semiconductor device A10 according to the first embodiment, and thus the drawings and description thereof will be omitted.

Figure 22:
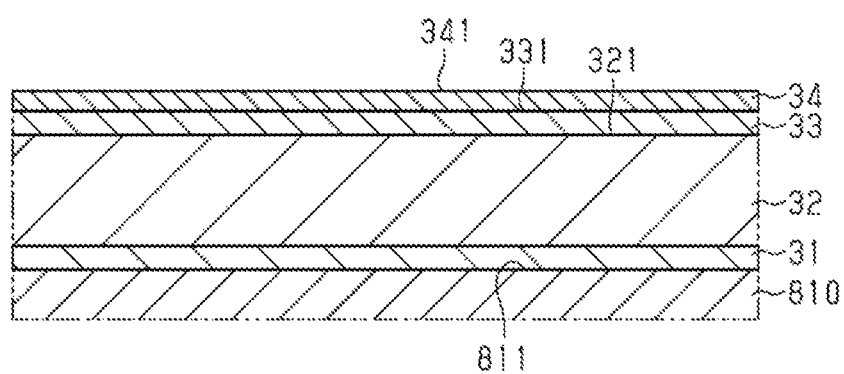
FIG. 22 is a schematic cross-sectional view for explaining a manufacturing process of a bonding portion according to the second embodiment.

FIGS. 22 to 25 are cross-sectional views for explaining a manufacturing process of the main surface wiring 23 and the bonding portion 40. As shown in FIG. 22, the metal layer 31, the first conductive layer 32, the first plating layer 33, and the second conductive layer 34 are laminated in this order on the upper surface 811 of the base material 810 that becomes the substrate 10.

First, the metal layer 31 is formed by, for example, a sputtering method. When the metal layer 31 includes a Ti layer and a Cu layer laminated on each other, first, the Ti layer in contact with the upper surface 811 of the base material 810 is formed, and then the Cu layer in contact with the Ti layer is formed.

Next, the first conductive layer 32 is formed by, for example, an electrolytic plating method. In the electrolytic plating method, the first conductive layer 32 is formed by precipitating Cu as plating metal on the upper surface of the metal layer 31 using the metal layer 31 as the conductive path.

Next, the first plating layer 33 is formed by, for example, an electrolytic plating method. In the electrolytic plating method, the first plated layer 33 is formed by precipitating Ni as plating metal on the upper surface 321 of the first conductive layer 32 using the metal layer 31 and the first conductive layer 32 as the conductive paths.

Next, the second conductive layer 34 is formed by, for example, an electrolytic plating method. In the electroplating method, the second conductive layer 34 is formed by precipitating Cu as plating metal on the upper surface of the first plating layer 33 using the metal layer 31, the first conductive layer 32, and the first plating layer 33 as the conductive paths.

Figure 23:
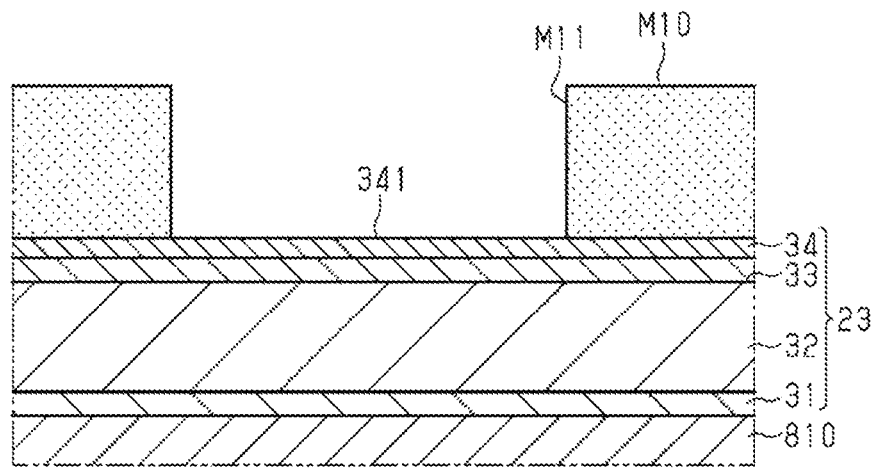
FIG. 23 is a schematic cross-sectional view for explaining a manufacturing process of a bonding portion according to the second embodiment.

As shown in FIG. 23, a mask M10 is formed on the upper surface 341 of the second conductive layer 34. The mask M10 is formed by, for example, photolithography using a photosensitive resist layer. A photosensitive resist layer is formed on the upper surface 341 of the second conductive layer 34. The resist layer is formed by spray coating a liquid photoresist, for example. Note that a film-shaped photoresist may be used. By exposing and developing the resist layer, the mask M10 having an opening M11 at a desired position is formed.

Figure 24:
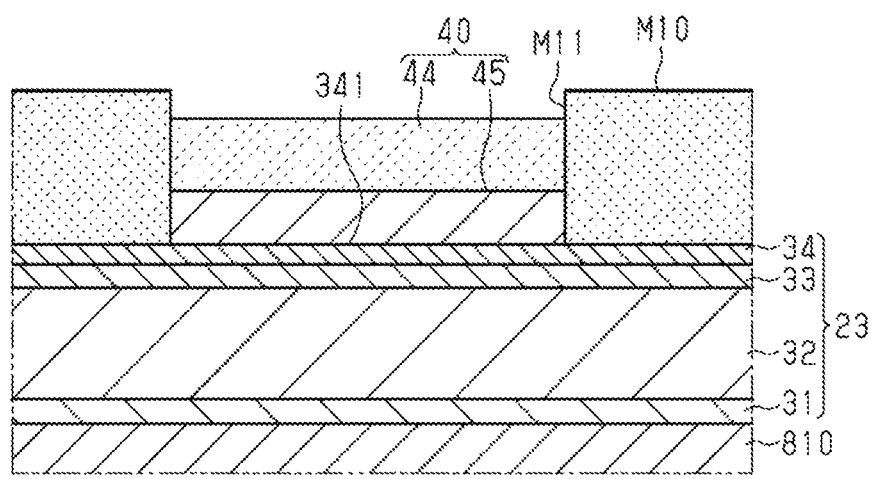
FIG. 24 is a schematic cross-sectional view for explaining a manufacturing process of a bonding portion according to the second embodiment.

As shown in FIG. 24, the second plating layer 45 and the solder layer 44 are laminated in this order on the upper surface of the second conductive layer 34 exposed from the opening M11 of the mask M10. First, the second plating layer 45 is formed on the upper surface 341 of the second conductive layer 34 exposed from the opening M11 of the mask M10 by, for example, an electrolytic plating method. The second plating layer 45 is formed by precipitating Ni as plating metal on the upper surface 341 of the second conductive layer 34 using the second conductive layer 34 as the conductive path.

Next, the solder layer 44 is formed on the upper surface of the second plating layer 45 exposed from the opening M11 of the mask M10 by, for example, an electrolytic plating method. The solder layer 44 is formed by precipitating an alloy containing Sn as plating metal on the upper surface 451 of the second plating layer 45 using the main surface wiring 23 and the second plating layer 45 as the conductive paths. In this way, the bonding portion 40 that partially covers the second conductive layer 34 is formed.

Figure 25:
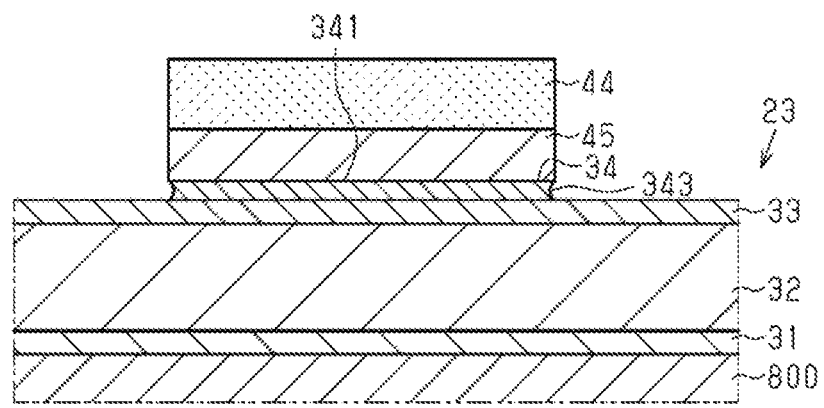
FIG. 25 is a schematic cross-sectional view for explaining a manufacturing process of a bonding portion according to the second embodiment.
Figure 25:

As shown in FIG. 25, the mask M10 is removed, and a portion of the second conductive layer 34 that is not covered by the bonding portion 40 is removed by etching. The etching is, for example, wet etching. An etching solution for the second conductive layer containing Cu is used. In this wet etching, the etching proceeds isotropically with respect to the second conductive layer 34, and the second conductive layer 34 is etched inward. Thus, the side surface 343 of the second conductive layer 34 has a concave shape facing inward.

The operation of the semiconductor device A20 according to the second embodiment will be described. In the semiconductor device A20 according to the second embodiment, the wiring portion 20 includes the metal layer 31, the first conductive layer 32, the first plating layer 33, and a second conductive layer 34. The first conductive layer 32 and the second conductive layer 34 are made of Cu, and the first plating layer 33 is made of Ni. In such a wiring portion 20, the first conductive layer 32, the first plating layer 33, and the second conductive layer 34 are formed in one process. Therefore, no oxide film is formed between the first plating layer 33 made of Ni and the second conductive layer 34 made of Cu. Therefore, the second conductive layer 34 adheres to the first plating layer 33.

Then, the second plating layer 45 constituting the bonding portion 40 can be easily formed on the second conductive layer 34 made of Cu even if an oxide film is formed on the surface of the second conductive layer 34, thereby adhering to the second conductive layers 34. For this reason, the adhesion of the bonding portion 40 to the wiring portion 20 can be improved, thereby preventing the bonding portion 40 from peeling off.

Further, since the second plating layer 45 is easily formed on the second conductive layer 34, it is possible to suppress generation of an ungrown portion in the second plating layer 45. Therefore, it is possible to suppress an increase in the resistance of the second plating layer 45, that is, an increase in the resistance of the wiring portion 20.

As described above, the second embodiment has the following effects.

(2-1) The wiring portion 20 of the semiconductor device A20 includes the metal layer 31, the first conductive layer 32, the first plating layer 33, and the second conductive layer 34. The first conductive layer 32 and the second conductive layer 34 are made of Cu, and the first plating layer 33 is made of Ni. The bonding portion 40 includes the second plating layer 45 and the solder layer 44. The second plating layer 45 is made of Ni. Therefore, the second plating layer 45 and the first plating layer 33 prevent the solder layer 44 in the liquid phase from flowing out in the reflow process.

(2-2) The second plating layer 45 adheres to the second conductive layer 34 made of Cu. For this reason, the adhesion of the bonding portion 40 to the wiring portion 20 can be improved, thereby preventing the bonding portion 40 from peeling off.

(2-3) Since the second plating layer 45 is easily formed on the second conductive layer 34, it is possible to suppress generation of an ungrown portion in the second plating layer 45. Therefore, it is possible to suppress an increase in the resistance of the second plating layer 45, that is, an increase in the resistance of the wiring portion 20.

Third Embodiment

Figure 26:
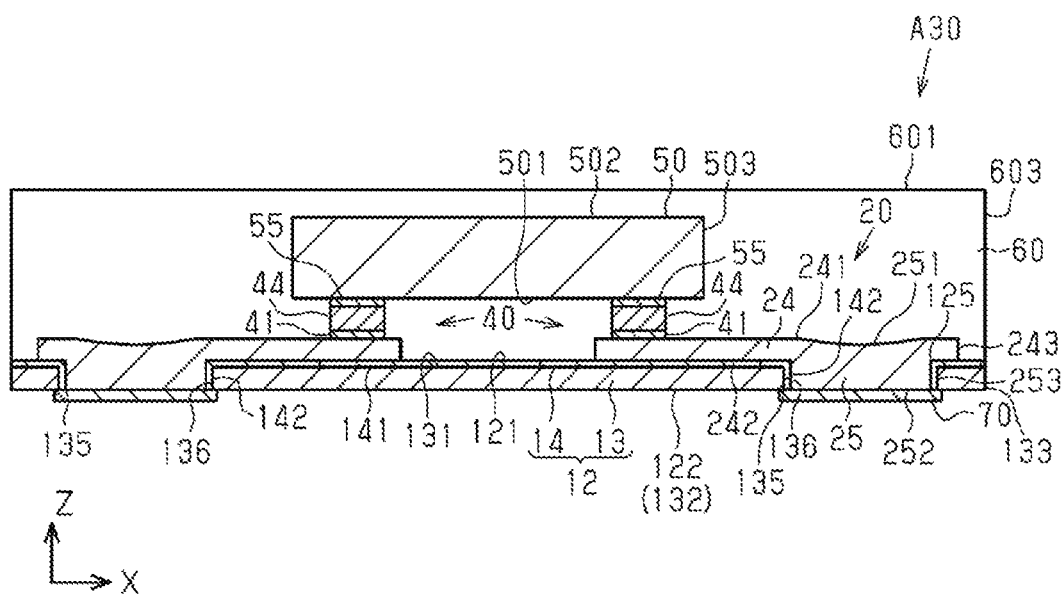
FIG. 26 is a schematic cross-sectional view showing a semiconductor device according to a third embodiment of the present disclosure.
Figure 27:
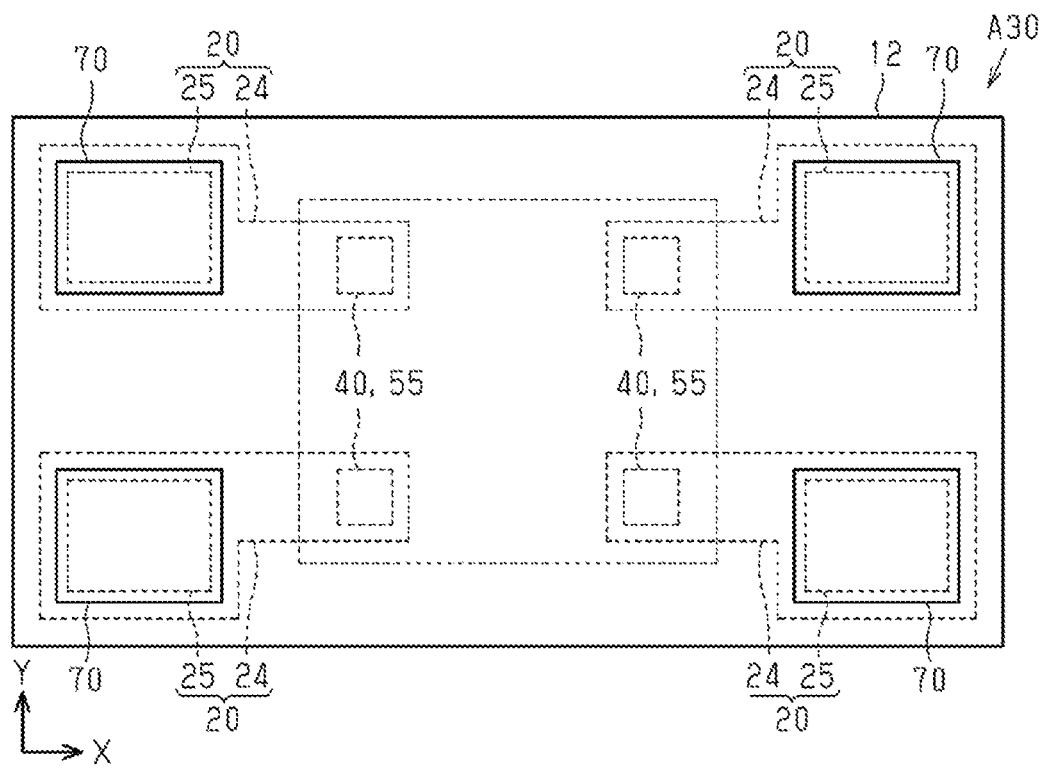
FIG. 27 is a schematic plan view showing the semiconductor device according to the third embodiment.

A third embodiment will be now described. As shown in FIGS. 26 and 27, a semiconductor device A30 includes a substrate 12, the wiring portion 20, an external conductive film 70, the semiconductor element 50, and the sealing resin 60. The wiring portion 20 includes a main surface wiring 24 and a pillar body 25 as a through-wiring.

FIG. 26 is a schematic cross-sectional view of the semiconductor device A30 according to the third embodiment, and FIG. 27 is a schematic plan view of the semiconductor device A30 according to the third embodiment as viewed from the substrate 12 side. For convenience of understanding, in FIG. 27, each member provided in the semiconductor device A30 is indicated by a broken line so as to appear transparent through the substrate 12 and the sealing resin 60 and show a positional relationship between the members.

The substrate 12 has a rectangular shape when viewed from the thickness direction z. The substrate 12 includes a base material 13 and an insulating layer 14. The base material 13 includes a main surface 131, a back surface 132, and a plurality of side surfaces 133. The main surface 131 and the back surface 132 face opposite sides in the thickness direction z. The main surface 131 and the back surface 132 are flat. The base material 13 is made of, for example, a material having electrical insulation properties. As this material, for example, a single crystal intrinsic semiconductor material such as silicon (Si), or a synthetic resin mainly made of an epoxy resin or the like may be used. As the main surface 131 of the base material 13, for example, a (100) plane having a crystal orientation of (100) can be employed.

The base material 13 includes a plurality of through-holes 135. In the third embodiment, the base material 13 includes four through-holes 135. Each through-hole 135 penetrates from the main surface 131 to the back surface 132 of the base material 13 in the thickness direction z. Each through-hole 135 is provided near each of four corners of the base material 13. Each through-hole 135 has, for example, a rectangular shape when viewed from the thickness direction z. The shape of the through-hole 135 may be circular or polygonal. The inner wall surface 136 of each through-hole 135 intersects with the back surface 132. In the semiconductor device A30 shown in FIG. 26, the inner wall surface 136 is orthogonal to the back surface 132. The inner wall surface 136 may be inclined at a predetermined angle with respect to the back surface 132. An inclination angle of the inner wall surface 136 is an angle determined by a configuration of the base material 13 made of, for example, a semiconductor material, for example, a crystal orientation.

The insulating layer 14 is formed on the base material 13. The insulating layer 14 is formed so as to cover the main surface 131 of the base material 13 and the inner wall surface 136 of the through-hole 135. The insulating layer 14 includes a first insulating layer 141 that covers the main surface 131 of the base material 13, and a second insulating layer 142 that covers the inner wall surface 136 of the through-hole 135. The insulating layer 14 is a film having electrical insulation properties. In the third embodiment, the insulating layer 14 is made of $SiO_2$. This insulating layer 14 is formed by, for example, thermally oxidizing the base material 13. The thickness of the insulating layer 14 is, for example, not less than 0.7 μm and not more than 2.0 μm. The material, thickness, and formation method of the insulating layer 14 are not particularly limited. For example, the insulating layer 14 may include $SiO_2$ and a resin layer. Further, the insulating layer 14 may be made of a resin layer.

As described above, the substrate 12 includes the base material 13 and the insulating layer 14. The base material 13 is made of a single crystal intrinsic semiconductor material and includes a through-hole 135 penetrating the base material 13 from the main surface 131 to the back surface 132. The insulating layer 14 is formed so as to cover the main surface 131 of the base material 13 and the inner wall surface 136 of the through-hole 135 of the base material 13. Therefore, the upper surface of the insulating layer 14 (the first insulating layer 141) becomes the substrate main surface 121 of the substrate 12, and the back surface 132 of the base material 13 becomes the substrate back surface 122 of the substrate 12. The substrate 12 includes a through-hole 125 covered with the insulating layer 14 (the second insulating layer 142).

The wiring portion 20 of the third embodiment includes a plurality of main surface wirings 24 and a plurality of pillar bodies 25. The main surface wirings 24 are a portion of the wiring portion 20 formed on the substrate main surface 121 side of the substrate 12. The main surface wiring 24 includes an upper surface 241, a lower surface 242, and a side surface 243. The main surface wiring 24 of the third embodiment includes a metal layer, a conductive layer, and a first plating layer.

A bonding portion 40 is formed on the main surface wiring 24. The bonding portion 40 includes a second plating layer 41 and a solder layer 44. The semiconductor element 50 is connected to the solder layer 44. The second plating layer 41 is connected to the conductive layer exposed from an opening of the first plating layer constituting the main surface wiring 24, similar to that in the semiconductor device A10 according to the first embodiment (see FIG. 3). In the third embodiment, the wiring portion 20 (the main surface wiring 24) is configured to include a metal layer, a first conductive layer, a first plating layer, and a second conductive layer, and a second plating layer 41 may be formed on the second conductive layer.

The plurality of pillar bodies 25 is formed so as to penetrate the substrate 12. Each pillar body 25 is formed so as to fill a portion surrounded by the insulating layer 14 inside the through-hole 125.

Each pillar body 25 is exposed from the substrate main surface 121 and the substrate back surface 122 of the substrate 12, respectively. Each pillar body 25 includes an upper surface 251, a back surface 252, and a plurality of side surfaces 253. The upper surface 251 and the back surface 252 face opposite sides in the thickness direction z. The upper surface 251 is a curved surface that is curved so as to be concave toward the inside of the pillar body 25, that is, toward the back surface 252 of the pillar body 25. The back surface 252 is a surface exposed from the substrate back surface 122. The back surface 252 of the pillar body 25 is flush with the substrate back surface 122. The side surface 253 is in contact with the second insulating layer 142 of the insulating layer 14.

The shape of each pillar body 25 is not particularly limited, but it may be, for example, cylindrical. In the third embodiment, the main surface wiring 24 and the pillar body 25 are integrally made of the same material. The main surface wiring 24 and the pillar body 25 may be separately made of different materials.

The sealing resin 60 is disposed on the substrate main surface 121 side of the substrate 12 and is formed so as to cover the semiconductor element 50. In the third embodiment, the sealing resin 60 is formed so as to be in contact with the substrate main surface 121 of the substrate 12 and to cover the semiconductor element 50 and the wiring portion 20 (an upper surface 152 of the pillar body 25 and the main surface wiring 24). In the third embodiment, the sealing resin 60 overlaps the substrate 12 when viewed from the thickness direction z. The sealing resin 60 has a rectangular shape when viewed from the thickness direction z.

The sealing resin 60 has electrical insulation properties. The sealing resin 60 is made of, for example, a resin material colored in black or the like. The resin material is, for example, a synthetic resin such as an epoxy resin. The material and shape of the sealing resin 60 are not particularly limited.

The external conductive film 70 is formed on the substrate back surface 122 of the substrate 12. The external conductive film 70 is formed so as to cover the upper surface 251 of the pillar body 25. The external conductive film 70 becomes an external connection terminal of the semiconductor device A30. The external conductive film 70 includes, for example, a plurality of metal layers laminated on each other. Examples of the metal layers may include a Ni layer, a Pd (palladium) layer, and an Au (gold) layer. The material of the external conductive film 70 is not particularly limited. For example, the material may be formed by laminating a Ni layer and an Au layer, or may be Sn.

Manufacturing Process

Next, an example of a method of manufacturing the semiconductor device A30 according to the third embodiment will be described. FIGS. 28 to 35 are cross-sectional views for explaining a manufacturing process of the semiconductor device A30 according to the third embodiment. FIGS. 28 to 35 show a portion related to one semiconductor device A30. In FIGS. 28 to 35, two broken lines indicate a range that becomes one semiconductor device A30. Definitions of directions shown in these figures are the same as the definitions of the directions shown in FIGS. 26 and 27.

Figure 28:
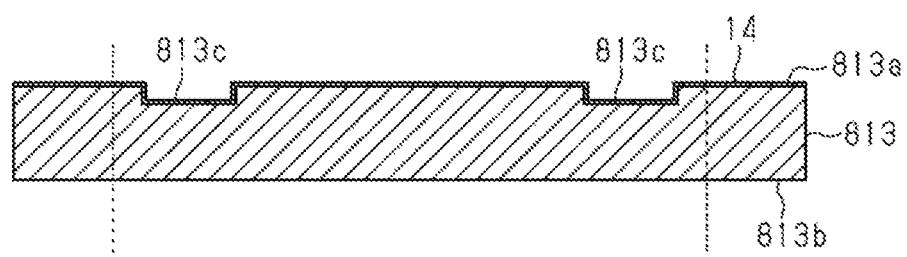
FIG. 28 is a schematic cross-sectional view for explaining a manufacturing process of the semiconductor device according to the third embodiment.

As shown in FIG. 28, a base material 813 is provided. The base material 813 corresponds to the base material 13 of the semiconductor device A30. The base material 813 is made of a single crystal semiconductor material and is, for example, a Si substrate. The base material 813 includes a main surface 813a and a back surface 813b facing opposite sides in the thickness direction. Then, a concave portion 813c concave from the main surface 813a of the base material 813 is formed. The concave portion 813c is a portion that will later become the through-hole 135. The concave portion 813c is formed by etching.

Next, an insulating layer 14 is formed on the surface of the base material 813. The insulating layer 14 is a portion to be the insulating layer 14 of the semiconductor device A30 shown in FIG. 26. The insulating layer 14 is formed over the entire surface of the base material 13 by, for example, thermally oxidizing the surface of the base material 813.

Figure 29:
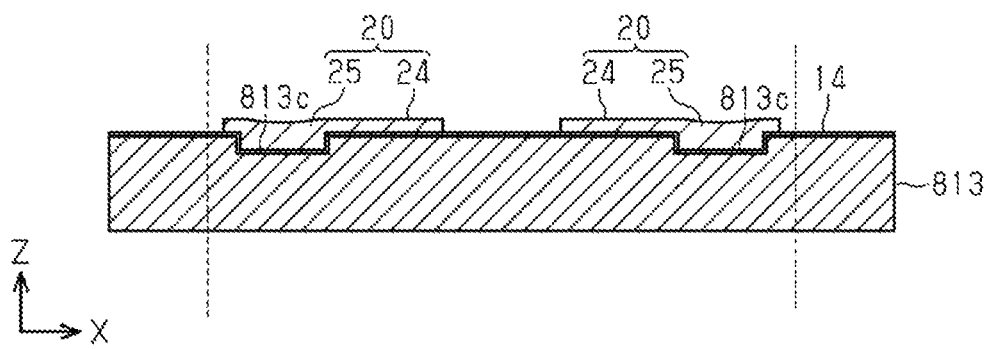
FIG. 29 is a schematic cross-sectional view for explaining a manufacturing process of the semiconductor device according to the third embodiment.

As shown in FIG. 29, a wiring portion 20 is formed. The wiring portion 20 of the third embodiment includes, for example, a metal layer, a conductive layer, and a first plating layer. First, the metal layer is formed on the insulating layer 14. The metal layer includes, for example, a Ti layer and a Cu layer laminated on each other. Next, the metal layer is covered with a resist layer, and the resist layer is exposed and developed to form a mask having an opening. Next, the conductive layer is formed by precipitating plating metal on the surface of the metal layer exposed from the mask by, for example, an electrolytic plating method using the metal layer as a conductive path. Next, the first plating layer is formed by precipitating plating metal on the conductive layer exposed from the mask by, for example, an electrolytic plating method. Then, the mask is removed, and the exposed metal layer is removed by, for example, etching to form the wiring portion 20 including the main surface wiring 24 and the pillar body 25.

Figure 30:
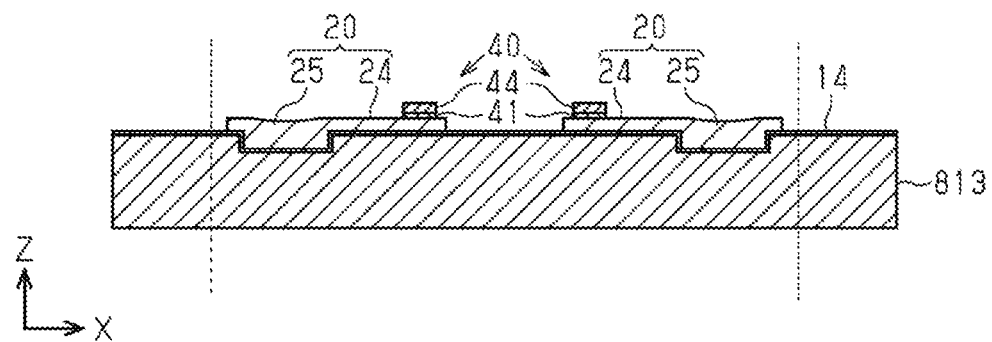
FIG. 30 is a schematic cross-sectional view for explaining a manufacturing process of the semiconductor device according to the third embodiment.

As shown in FIG. 30, a bonding portion 40 is formed. The bonding portion 40 of the third embodiment is the same as the bonding portion 40 of the first embodiment. That is, the bonding portion 40 includes a second plating layer 41 and a solder layer 44. First, the second plating layer 41 is formed on the main surface wiring 24 of the wiring portion 20, and the solder layer 44 is formed on the second plating layer 41. The wiring portion 20 and the bonding portion 40 of the third embodiment may have the same configuration as the wiring portion 20 and the bonding portion 40 of the second embodiment.

Figure 31:
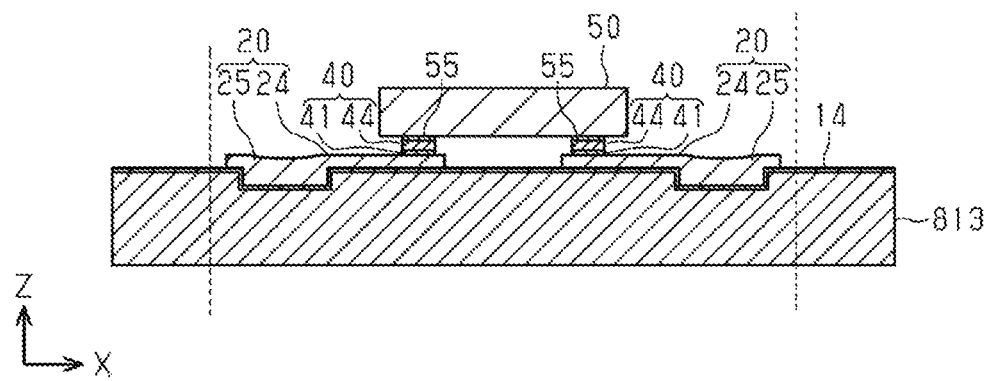
FIG. 31 is a schematic cross-sectional view for explaining a manufacturing process of the semiconductor device according to the third embodiment.

As shown in FIG. 31, the semiconductor element 50 is mounted. The mounting of the semiconductor element 50 is performed by flip chip bonding (FCB). For example, after applying a flux to the semiconductor element 50, the semiconductor element 50 is temporarily attached to the bonding portion 40 using a flip chip bonder. Thereafter, the semiconductor element 50 is connected to the bonding portion 40 by bringing the solder layer 44 of the bonding portion 40 into a liquid phase state by reflow and solidifying the solder layer 44 by cooling.

Figure 32:
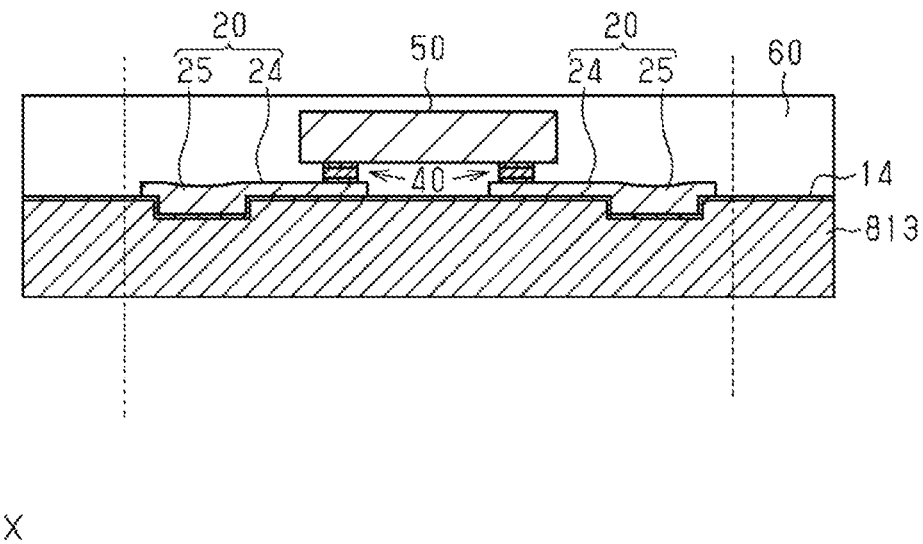
FIG. 32 is a schematic cross-sectional view for explaining a manufacturing process of the semiconductor device according to the third embodiment.

As shown in FIG. 32, a sealing resin 60 covering the upper surface of the insulating layer 14 and the semiconductor element 50 is formed. The sealing resin 60 is, for example, a synthetic resin mainly made of an epoxy resin. For example, the sealing resin 60 is formed by transfer molding.

Figure 33:
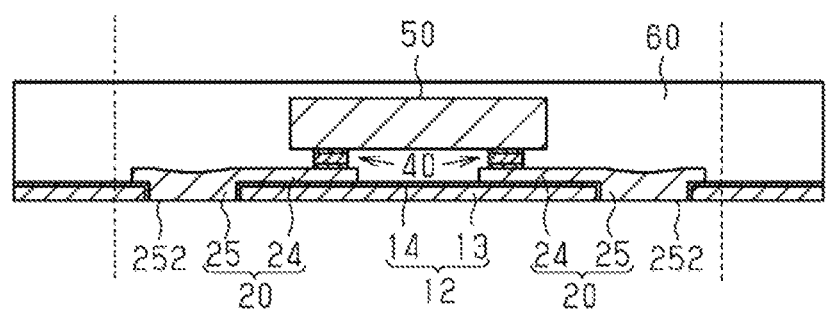
FIG. 33 is a schematic cross-sectional view for explaining a manufacturing process of the semiconductor device according to the third embodiment.

As shown in FIG. 33, a portion of the base material 813 is ground by, for example, mechanical grinding. The base material 813 is ground from the back surface 813b side (the lower part in the figure) to expose the wiring portion 20 (the pillar body 25) formed in the concave portion 813c. After the grinding, the surface opposite to the main surface 813a of the base material 813 becomes the back surface 132. That is, by this grinding process, the base material 13 having the through-hole 135 and the wiring portion 20 having the pillar body 25 exposed on the back surface 132 side of the base material 13 and the main surface wiring 24 are formed.

Figure 34:
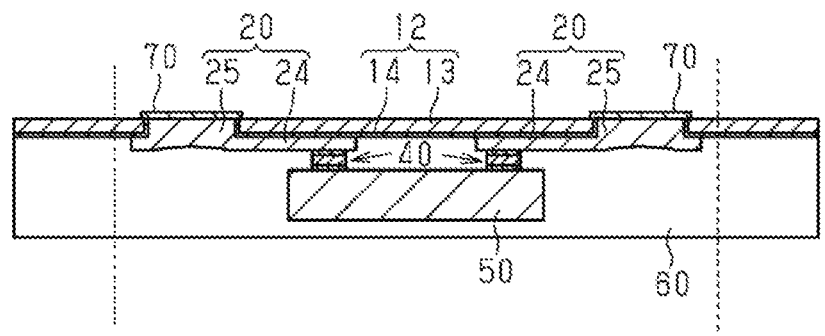
FIG. 34 is a schematic cross-sectional view for explaining a manufacturing process of the semiconductor device according to the third embodiment.
Figure 34:

As shown in FIG. 34, an external conductive film 70 is formed on the back surface 252 of the pillar body 25 exposed from the back surface 132 of the base material 13. The external conductive film 70 is made of, for example, plating metal. For example, the external conductive film 70 is formed by precipitating plating metal, for example, Ni, Pd and Au, in this order by an electroless plating. The structure and forming method of the external conductive film 70 are not particularly limited.

Figure 35:
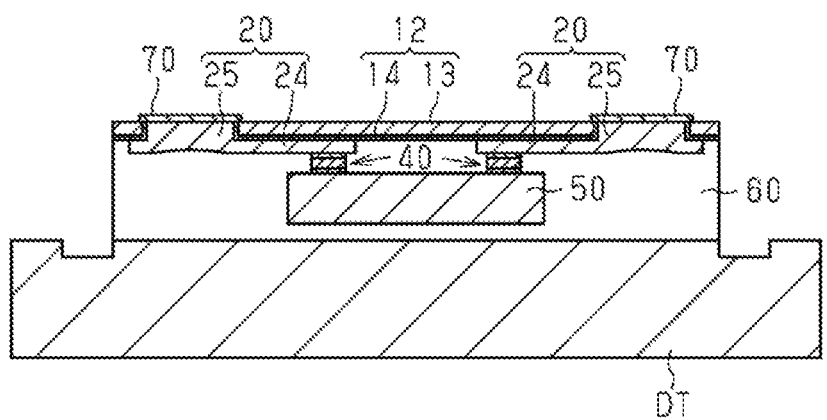
FIG. 35 is a schematic cross-sectional view for explaining a manufacturing process of the semiconductor device according to the third embodiment.
Figure 35:
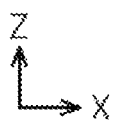

As shown in FIG. 35, a dicing tape DT is attached to the resin upper surface 601 of the sealing resin 60, and the base material 13, the insulating layer 14, and the sealing resin 60 are cut along the first direction x and the second direction y by a dicing blade to form individual semiconductor devices A30. Through the above process, the semiconductor device A30 is manufactured.

As described above, the third embodiment may have the following effects.

(3-1) In the semiconductor device A30 using the base material 13 made of a single crystal semiconductor material, the outflow of the solder layer 44 in the reflow process when the semiconductor element 50 is mounted can be suppressed.

Modification of the Third Embodiment

An insulating layer may be formed on the back surface 132 of the base material 13. The insulating layer is a film having electrical insulation properties. As the insulating layer formed on the back surface 132, for example, a material containing $SiO_2$, a resin, or $SiO_2$ and a resin may be used.

Modifications

The present embodiment may be implemented with the following modifications.

Figure 36:
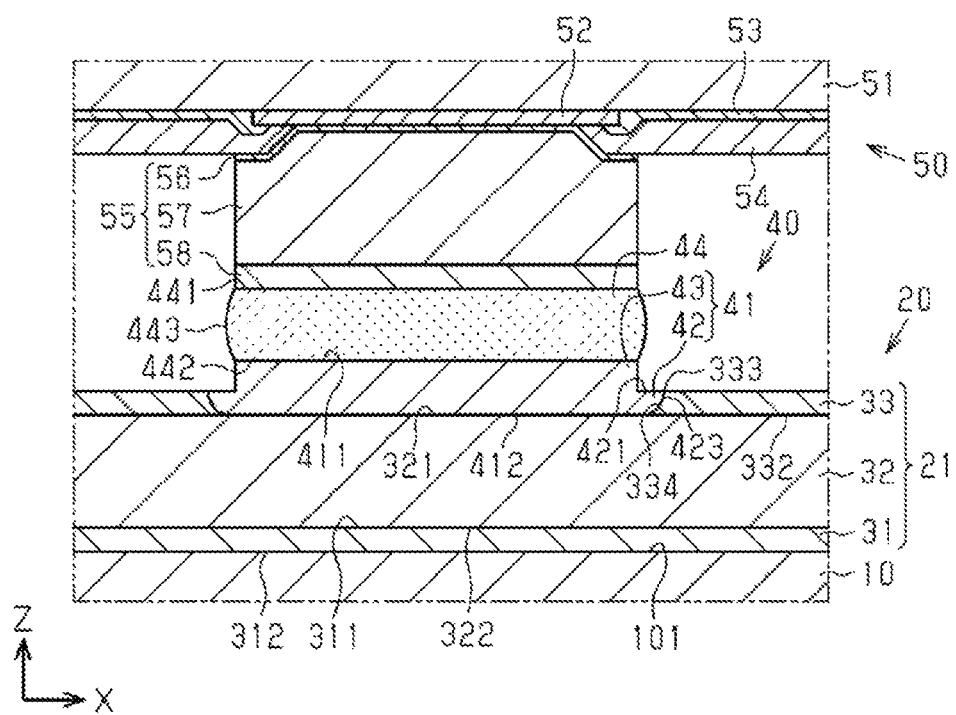
FIG. 36 is a schematic cross-sectional view showing a bonding portion of a semiconductor device according to a modification.

As shown in FIG. 36, the side surface 443 of the solder layer 44 of the bonding portion 40 may be a surface curved toward the outside of the solder layer 44.

According to the present disclosure in some embodiments, it is possible to provide a semiconductor device capable of suppressing an outflow of a solder.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a substrate including a main surface;
a wiring portion including a first conductive layer formed on the main surface, and a first plating layer which is provided on the first conductive layer and on which an oxide film is formed;
a semiconductor element including an element mounting surface and an element electrode formed on the element mounting surface;
a bonding portion including a second plating layer made of a same material as the first plating layer and laminated on the first conductive layer, and a solder layer laminated on the second plating layer and bonded to the element electrode; and
a sealing resin covering the semiconductor element,
wherein the first plating layer includes an opening exposing an upper surface of the first conductive layer, and
wherein the second plating layer is filled in at least the opening to be connected to the first plating layer.

2. The semiconductor device of claim 1, wherein an inner wall surface of the opening is formed in a concave shape facing an inside of the first plating layer.

3. The semiconductor device of claim 1, wherein an inner wall surface of the opening includes a first portion at a lower surface side of the first plating layer and a second portion at an upper surface side of the first plating layer, the first portion being smaller than the second portion.

4. The semiconductor device of claim 1, wherein the second plating layer is provided in the opening and protrudes from an upper surface of the first plating layer.

5. The semiconductor device of claim 1, wherein the second plating layer includes a filling portion filled in the opening, and a protruding portion protruding from an upper surface of the first plating layer.

6. The semiconductor device of claim 5, wherein the filling portion is larger than the protruding portion when viewed from a thickness direction perpendicular to the main surface.

7. The semiconductor device of claim 5, wherein the opening of the first plating layer is larger than the protruding portion of the second plating layer when viewed from a thickness direction perpendicular to the main surface.

8. The semiconductor device of claim 5, wherein an upper surface of the filling portion is flush with the upper surface of the first plating layer.

9. The semiconductor device of claim 1, wherein the substrate includes a through-hole penetrating the substrate from the main surface to a back surface facing an opposite side of the main surface, and
wherein the wiring portion includes a main surface wiring including the first conductive layer and the first plating layer, and a through-wiring provided in the through-hole and connected to the main surface wiring.

10. The semiconductor device of claim 9, wherein the through-wiring includes an exposed surface exposed from the substrate, and
wherein the semiconductor device further comprises an external conductive film covering the exposed surface of the through-wiring.

11. The semiconductor device of claim 9, wherein the substrate is made of a resin.

12. The semiconductor device of claim 9, wherein the substrate is made of a semiconductor material, and
wherein the substrate includes a first insulating layer interposed between the main surface and the first conductive layer and a second insulating layer interposed between an inner wall of the through-hole and the through-wiring.

13. The semiconductor device of claim 12, wherein the through-wiring includes an upper surface facing the first conductive layer, and the upper surface has a concave shape toward an inside of the through-wiring.

14. The semiconductor device of claim 1, wherein the sealing resin includes a through-hole penetrating from an upper surface of the wiring portion to an upper surface of the sealing resin, and
wherein the wiring portion includes a main surface wiring including the first conductive layer and the first plating layer, and a through-wiring provided in the through-hole and connected to the main surface wiring.

15. The semiconductor device of claim 14, wherein the through-wiring includes an exposed surface exposed from the sealing resin, and
wherein the semiconductor device further comprises an external conductive film covering the exposed surface of the through-wiring.

16. The semiconductor device of claim 1, wherein the first conductive layer is made of Cu, and wherein the first plating layer and the second plating layer are made of Ni.

17. The semiconductor device of claim 1, further comprising a metal layer formed on a lower surface of the first conductive layer.

18. The semiconductor device of claim 17, wherein the metal layer contains Ti.

* * * * *